US012805019B2

(12) United States Patent
Chiu et al.

(10) Patent No.: US 12,805,019 B2
(45) Date of Patent: Nov. 17, 2026

(54) METHOD OF MANUFACTURING SEMICONDUCTOR DEVICE HAVING STAGGERED GATE-STUB-SIZE PROFILE AND SYSTEM FOR SAME

(71) Applicant: TAIWAN SEMICONDUCTOR MANUFACTURING COMPANY, LTD., Hsinchu (TW)

(72) Inventors: Te-Hsin Chiu, Hsinchu (TW); Shih-Wei Peng, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 450 days.

(21) Appl. No.: 18/447,979

(22) Filed: Aug. 10, 2023

(65) Prior Publication Data

US 2023/0387102 A1 Nov. 30, 2023

Related U.S. Application Data

(62) Division of application No. 17/108,600, filed on Dec. 1, 2020, now Pat. No. 11,842,994.

(Continued)

(51) Int. Cl.

| | |
|---|---|
| ***H10D 89/10*** | (2025.01) |
| ***G06F 30/392*** | (2020.01) |
| ***H10D 84/83*** | (2025.01) |

(52) U.S. Cl.

CPC .......... *H10D 89/10* (2025.01); *G06F 30/392* (2020.01); *H10D 84/83* (2025.01)

(58) Field of Classification Search

CPC .... H10D 89/10; H10D 84/83; H10D 84/0135; H10D 84/0149; H10D 84/038;

(Continued)

(56) References Cited

U.S. PATENT DOCUMENTS

| | | | | |
|---|---|---|---|---|
| 7,260,442 | B2 | 8/2007 | Hwang et al. | |
| 8,609,498 | B2 * | 12/2013 | Kronholz | H10D 84/83 438/300 |

(Continued)

FOREIGN PATENT DOCUMENTS

| | | |
|---|---|---|
| KR | 20180129673 | 12/2018 |
| KR | 20190037180 | 4/2019 |

(Continued)

OTHER PUBLICATIONS

Office Action dated Jul. 21, 2021 for corresponding case No. TW 11020701120. (pp. 1-4).

(Continued)

*Primary Examiner* — William B Partridge
*Assistant Examiner* — David Paul Sedorook
(74) *Attorney, Agent, or Firm* — Hauptman Ham, LLP

(57) ABSTRACT

A method (of manufacturing a semiconductor device) includes generating a corresponding layout diagram including: regarding first and second active area patterns which (1) are correspondingly nearest to a boundary between, and (2) are correspondingly in, first and second abutting cells, and for each gate pattern that intersects the first or second active area pattern, selecting the gate patterns for which a first distance from a nearest corresponding via-to-gate (VG) pattern to a corresponding cut-gate section is equal to or greater than a first reference value; and for each selected gate pattern, relative to a first size, setting a size of a corresponding cut-gate section to a second size; the first size otherwise resulting in an overhang of a gate remnant portion extending towards the boundary by a first length; and the second size resulting in the overhang extending by a second length smaller than the first length.

20 Claims, 13 Drawing Sheets

Related U.S. Application Data

(60) Provisional application No. 63/018,061, filed on Apr. 30, 2020.

(58) Field of Classification Search
CPC ... G06F 30/392; H01L 23/528; H01L 27/088; H01L 27/0207; H01L 21/823475; H01L 21/823437
See application file for complete search history.

(56) References Cited

U.S. PATENT DOCUMENTS

| | | | |
|---|---|---|---|
| 9,256,709 B2 | 2/2016 | Yu et al. | |
| 9,595,536 B1 * | 3/2017 | Haigh | H01L 23/528 |
| 2005/0124095 A1 | 6/2005 | Liaw | |
| 2007/0267680 A1 | 11/2007 | Uchino et al. | |
| 2013/0207199 A1 | 8/2013 | Becker et al. | |
| 2014/0040838 A1 | 2/2014 | Liu et al. | |
| 2015/0111367 A1 | 4/2015 | Lin et al. | |
| 2015/0278429 A1 | 10/2015 | Chang | |
| 2016/0093603 A1 * | 3/2016 | Hsieh | H10D 89/10 257/369 |
| 2018/0082846 A1 * | 3/2018 | Yang | H10D 30/6211 |
| 2018/0336293 A1 * | 11/2018 | Liu | G06F 30/327 |
| 2019/0006388 A1 | 1/2019 | Agarwal et al. | |
| 2019/0065659 A1 * | 2/2019 | Biswas | G06F 30/39 |
| 2019/0319112 A1 * | 10/2019 | Zang | H10D 84/0193 |
| 2020/0074039 A1 | 3/2020 | Lu et al. | |
| 2020/0074044 A1 | 3/2020 | Peng et al. | |

FOREIGN PATENT DOCUMENTS

| | | |
|---|---|---|
| KR | 20200037108 | 4/2020 |
| TW | 201913842 | 4/2019 |

OTHER PUBLICATIONS

Office Action dated Dec. 29, 2021 for corresponding case No. KR 10-2021-0013245. English abstract attached on p. 1. (pp. 1-6).
Office Action dated Feb. 28, 2022 for corresponding case No. DE 10 2020 132 921.0 (pp. 1-11).

* cited by examiner

METHOD OF MANUFACTURING SEMICONDUCTOR DEVICE HAVING STAGGERED GATE-STUB-SIZE PROFILE AND SYSTEM FOR SAME

PRIORITY CLAIM AND CROSS-REFERENCE

The present application is a divisional of U.S. application Ser. No. 17/108,600, filed Dec. 1, 2020, now U.S. Pat. No. 11,842,994 issued Dec. 12, 2023, and claims the priority of U.S. Provisional Application No. 63/018,061, filed Apr. 30, 2020, each of which is incorporated herein by reference in its entirety.

BACKGROUND

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization.

Typically, a set of design rules is specific to a process/technology node by which will be fabricated a semiconductor device based on a layout diagram. The design rule set compensates for variability of the corresponding process/technology node. Such compensation increases the likelihood that an actual semiconductor device resulting from a layout diagram will be an acceptable counterpart to the virtual device on which the layout diagram is based.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
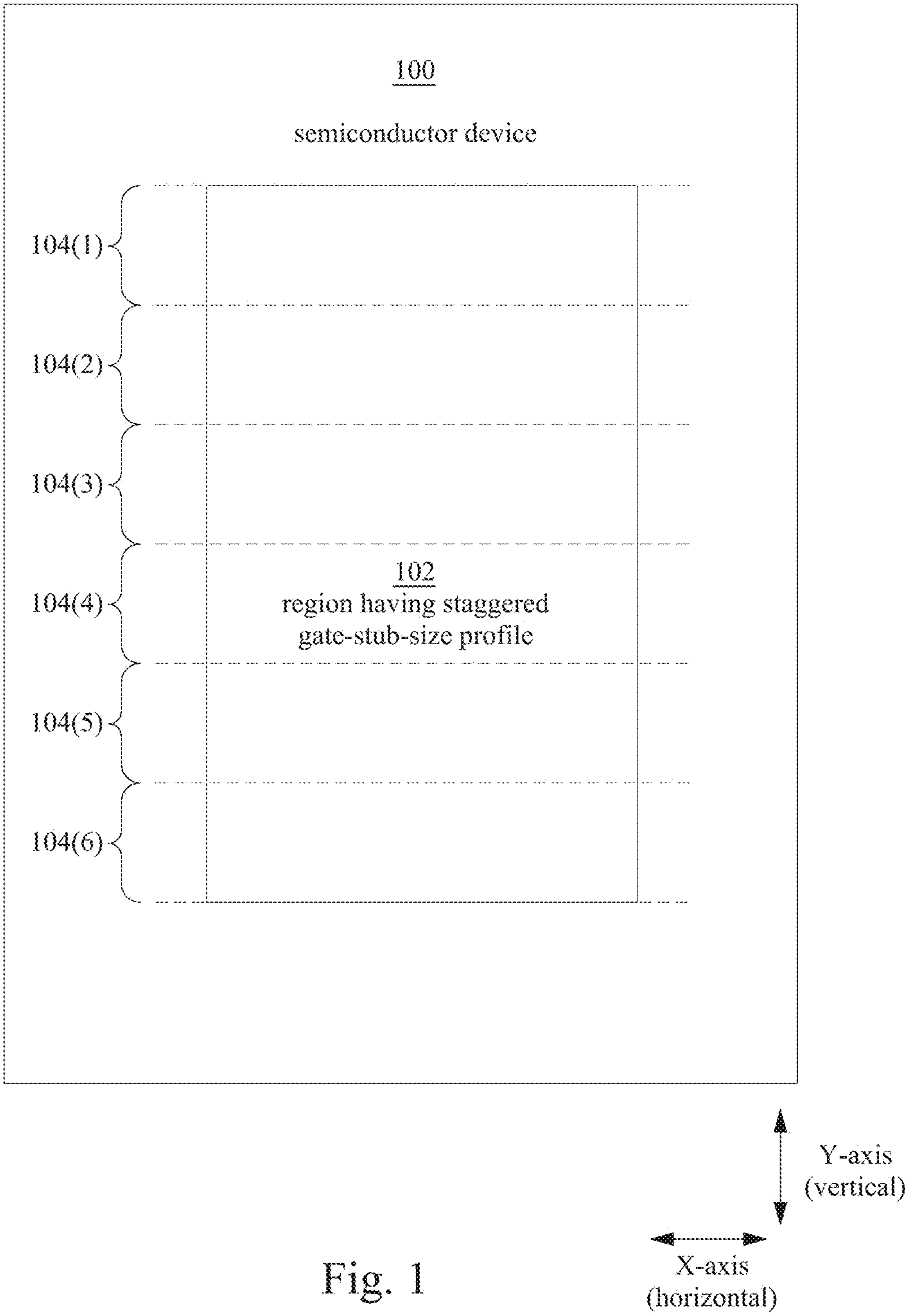
FIG. 1 is a block diagram of a semiconductor device 100 in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A cut-gate pattern which overlies a gate pattern indicates that any underlying portion of the gate pattern is designated for removal, with remaining portions of the gate pattern being referred to as a pair of remnant patterns. For a pair of gate electrodes in a semiconductor device which results from the pair of remnant patterns in a layout diagram, there is a tendency for the pair of gate electrodes to suffer crosstalk between one another, e.g., due to capacitive coupling, or the like. The tendency, or degree to which the pair of gate electrodes is likely to suffer crosstalk, is directly proportional to the amount of separation (gap-size) between the nearest ends of the gate electrodes.

In some embodiments, (A) for each pair of remnant patterns in a given layout diagram which result from a portion of a gate pattern having been designated for cutting, or (B) for each pair of gate electrodes which results from the given layout diagram, gap-sizes between (A) the nearest ends of the remnant patterns or (B) the nearest ends of the gate electrodes, gaps therebetween are expanded where conditions are satisfied.

In some embodiments, a layout diagram is generated according to a 'selective expansion' technique in which cut-gate sections are selectively expanded. In some embodiments, a layout diagram is generated according to an 'expand all, revert some' technique which all cut-gate sections are expanded from a first size to a larger second size, and then some of the cut-gate sections are reverted from the second size to the first size. A size of the cut-gate section is measured form a corresponding row-boundary, with the first size being represented by a size of an initial cut-gate pattern, and the second size being represented by the initial cut-gate pattern and a supplemental cut-gate pattern which are abutted together.

According to another approach, each cut-gate section which includes only the initial cut-gate pattern accordingly yields corresponding pairs of electrodes with substantially the same tendency to suffer crosstalk. As compared to the other approach, an advantage of some embodiments is that the tendency to suffer crosstalk is reduced because consideration is given to whether a corresponding VG pattern is proximal or distal relative to the corresponding row-boundary and the corresponding AA pattern. For some embodiments, as a result, for a given pair of nearest substantially collinear remnant patterns, the separation between the nearest ends of the remnant patterns is one of three possible sizes because the corresponding cut-gate section has one of three possible sizes, S1, S2 or S3. Further according to some embodiments, at most about 25% of remnant pattern pairs have a separation distance of S1, which about 75% of the remnant pattern pairs have a separation distance of S2 or S3.

FIG. 1 is a block diagram of a semiconductor device 100 in accordance with some embodiments.

In FIG. 1, semiconductor device 100 includes, among other things, a region 102 having one or more staggered gate-stub-size profiles. Region 102 is organized into rows 104(1), 104(2), 104(3), 104(4), 104(5) and 104(6) which extend in a first direction. Corresponding ones of rows 104(1)-104(6) substantially abut in a second direction, the second direction being substantially perpendicular to the first direction. In some embodiments, the first and second directions correspondingly are the X-axis and the Y-axis. Example layout diagrams resulting in a region 102 include the layout diagrams disclosed herein.

Figure 2A:
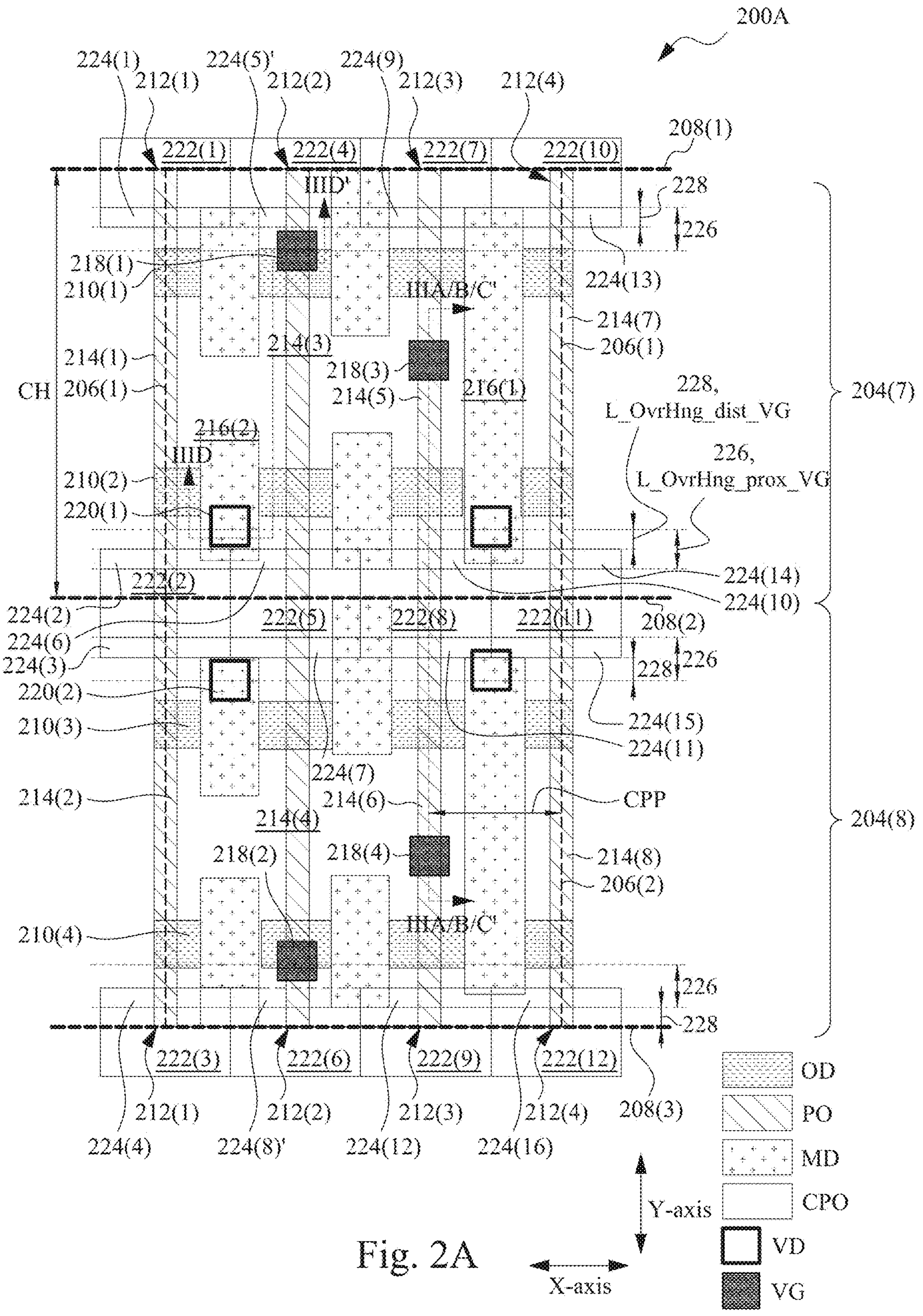
FIGS. 2A and 2B are corresponding layout diagrams, in accordance with some embodiments.

FIG. 2A is layout diagram 200A, in accordance with some embodiments.

Figure 7:
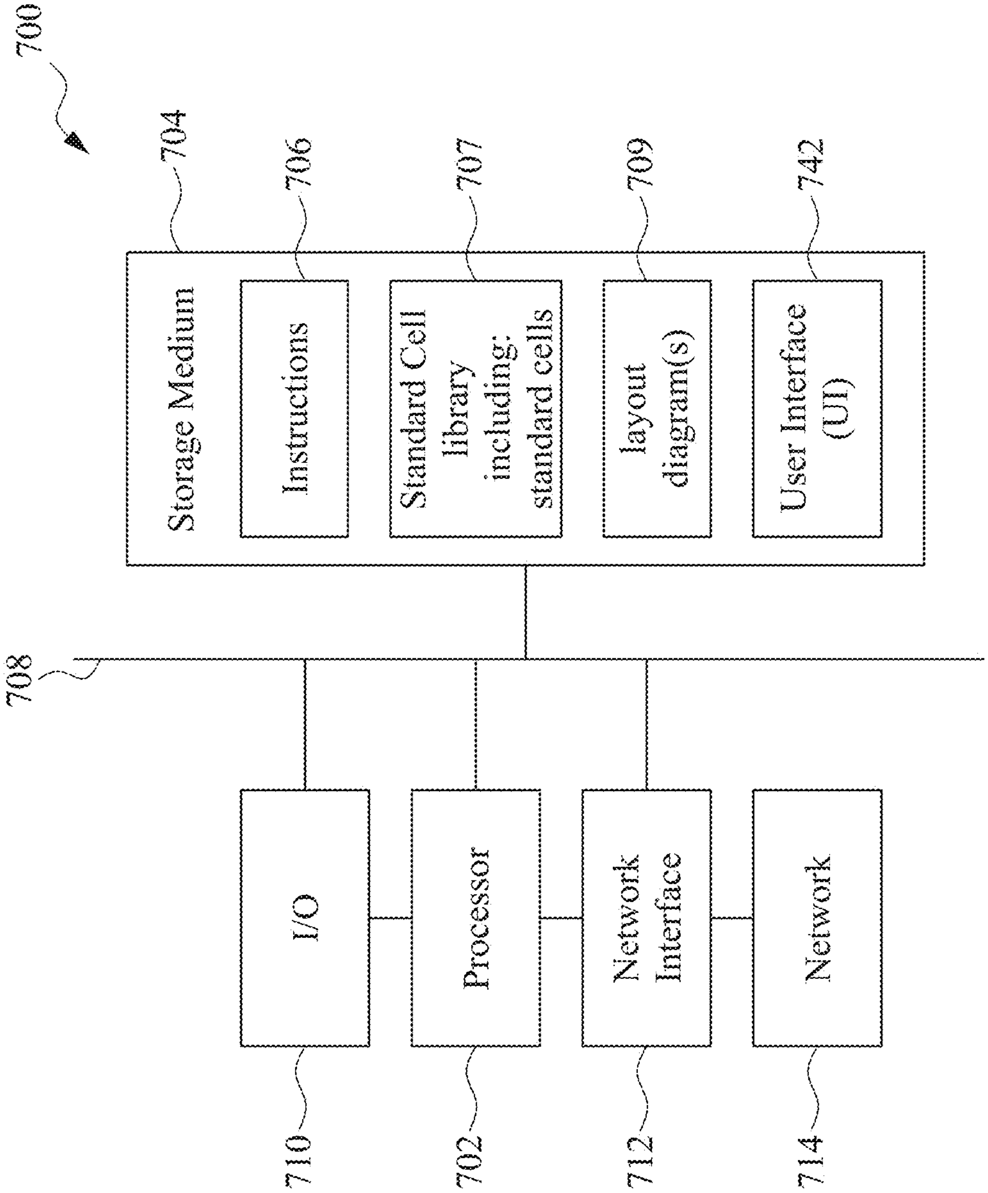
FIG. 7 is a block diagram of an electronic design automation (EDA) system, in accordance with some embodiments.

In some embodiments, layout diagram 200A of FIG. 2A is stored on a non-transitory computer-readable medium (see FIG. 7).

FIG. 2A follows a similar numbering scheme to that of FIG. 1. Though corresponding, some components also differ. To help identify components which correspond but nevertheless have differences, the numbering convention uses 2-series numbers for FIG. 2A while FIG. 1 uses 1-series numbers. For example, items 204(7) and 204(8) in FIG. 2A are rows, and items 104(1)-104(6) in FIG. 1 are rows, and wherein: similarities are reflected in the common root _04 (_); and differences are reflected in the corresponding leading digit 2__(_) in FIG. 2A and 1__(_) in FIG. 1, and in the numeral within the corresponding parenthetical, e.g., ___(7) in FIG. 2A and ___(1) through___(6) in FIG. 1. For brevity, the discussion will focus more on differences between FIG. 2A and FIG. 1 than on similarities.

Figure 2B:
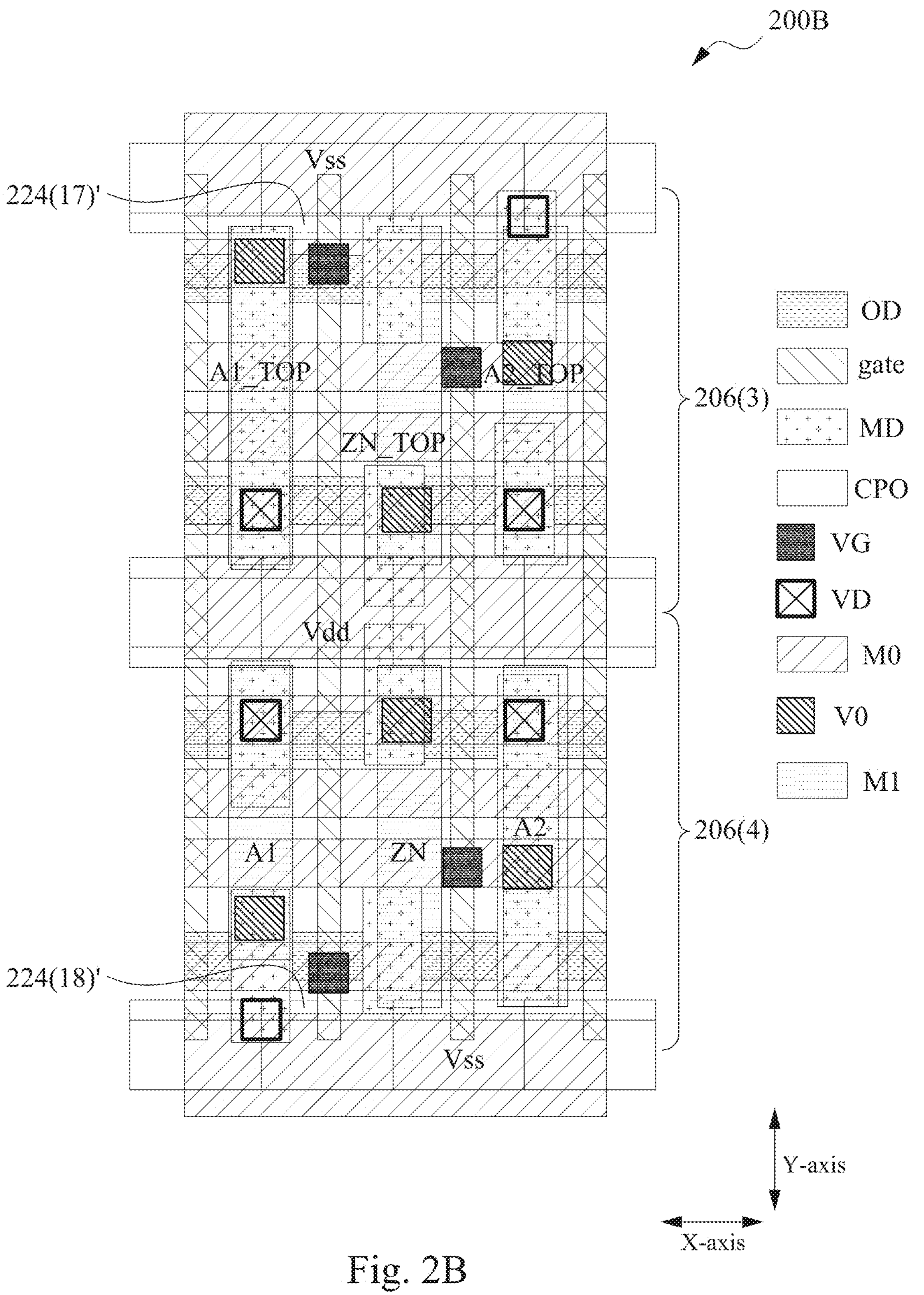

Layout diagram 200A is arranged into rows 204(7) and 204(8) which extend substantially in a first direction and are populated correspondingly with cells 206(1)) and 206(2). Though simplified, e.g., because M0, V0 and M1 patterns are not shown whereas instances of such patterns are shown in FIG. 2B, nevertheless cells 206(1) and 206(2) are combined to represent a two input NAND (ND2) gate. In some embodiments, relative to a unit of current-driving capacity, D, the NAND gate of layout diagram 200A has a current-driving capacity of D, such that layout diagram 200B represents an ND2D1 logical gate. Rows 204(7) and 204(8) share row-boundary 208(2).

Row width and cell width are understood relative to the first direction. Row height and cell height are understood relative to a second direction which is substantially perpendicular to the first direction. In some embodiments, the first and second directions correspondingly are the X-axis and the Y-axis. Relative to the Y-axis, row 204(7) abuts row 204(8) at row boundary 208(2).

In FIG. 2A, rows 204(7) and 204(8) have substantially the same height. Each of cells 206(1) and 206(2) has substantially the same height as corresponding rows 204(7) and 204(8), with the cell height being shown in FIG. 2A as CH. In some embodiments, rows 204(7) and 204(8) have substantially different heights. For simplicity of illustration, only two rows are shown in layout diagram 200A. As a practical matter, layout diagrams typically include many more than two rows. Accordingly, in some embodiments, layout diagram 200A includes more than two rows. Similarly, for simplicity of illustration, only one cell is shown in each of rows 204(7) and 204(8). As a practical matter, each row in layout diagram typically includes many more than one cell. Accordingly, in some embodiments, layout diagram 200A includes more than one cell in corresponding one or more of the rows.

Layout diagram 200A includes: active area (AA) patterns 210(1), 210(2), 210(3) and 210(4); gate patterns 212(1), 212(2), 212(3) and 212(4); conductor-on-drain/source contact patterns, which are referred to herein as metal-to-drain/source contact (MD) patterns, of which only two are numbered for simplicity of illustration, namely MD patterns 216(1) and 216(2); via-to-gate (VG) patterns 218(1), 218(2), 218(3) and 218(4); via-to-MD (VD) patterns, of which only two are numbered for simplicity of illustration, namely VD patterns 220(1) and 220(2); initial cut-gate patterns 222(1), 222(2), 222(3), 222(4), 222(5), 222(6), 222(7), 222(8), 222(9), 222(10), 222(11) and 222(12); and supplemental cut-gate patterns 224(1), 224(2), 224(3), 224(4), 224(6), 224(7), 224(9), 224(10), 224(11), 224(12), 224(13), 224(14), 224(15) and 224(16).

Layout diagram 200A does not include what otherwise would be supplemental cut-gate patterns 224(5) and 224(8), as discussed below, and their absence is noted by corresponding ghosts 224(5)' and 224(8)'. Ghosts 224(5)' and 224(8)' are not patterns and are not included in layout diagram 200A, rather ghosts 224(5)' and 224(8)' are conceptual reminders for purposes of furthering discussion.

AA patterns 210(1)-210(4) are non-overlapping of each other and extend substantially in the direction of the X-axis. Initial cut-gate patterns 222(1)-222(12) are substantially non-overlapping of each other and extend substantially in the direction of the X-axis. Supplemental cut-gate patterns 224(1)-224(4), 224(6)-224(7) and **224(9)-*224(16) are substantially non-overlapping of each other, are substantially non-overlapping of initial cut-gate patterns 222(1)-222(12)**, and extend substantially in the direction of the X-axis.

Gate patterns 212(1)-212(4) are non-overlapping of each other and extend substantially in the direction of the Y-axis. The MD patterns, including MD patterns 212(1)-212(4), are non-overlapping of each other and extend substantially in the direction of the Y-axis. Neighboring gate patterns, e.g., gate patterns 212(3) and 212(4), are separated by a gate pitch, which is shown in FIG. 2A as one unit of a known distance, the distance being one contacted-poly pitch (CPP) for the corresponding semiconductor process technology node. In some embodiments, the gate pitch is a multiple of one CPP.

VG patterns 218(1)-218(4) are non-overlapping of each other. VG patterns 218(1) and 218(2) are substantially aligned over gate pattern 212(2). VG patterns 218(3) and 218(4) are substantially aligned over gate pattern 212(3). The VD patterns, including VD patterns 220(1) and 220(2), are non-overlapping of each other. The VD patterns are substantially aligned over corresponding ones of the MD patterns. In particular, VD patterns 220(1) and 220(2) are substantially aligned over MD pattern 216(2).

In FIG. 2A, initial cut-gate pattern 222(1) and supplemental cut-gate pattern 224(1) represent a corresponding cut-gate section. Initial cut-gate pattern 222(2) and supplemental cut-gate patterns 224(2) and 224(3) represent a corresponding cut-gate section. Initial cut-gate pattern 222(3) and supplemental cut-gate pattern 224(4) represent a corresponding cut-gate section. Initial cut-gate pattern 222(4) represents a corresponding cut-gate section. Initial cut-gate pattern 222(5) and supplemental cut-gate patterns 224(6) and 224(7) represent a corresponding cut-gate section. Initial cut-gate pattern 222(6) represents a corresponding cut-gate section. Initial cut-gate pattern 222(7) and supplemental cut-gate pattern 224(9) represent a corresponding cut-gate section. Initial cut-gate pattern 222(8) and supplemental cut-gate patterns 224(10) and 224(11) represent a corresponding cut-gate section. Initial cut-gate pattern 222(9) and supplemental cut-gate pattern 224(12) represent a corresponding cut-gate section. Initial cut-gate pattern 222(10) and supplemental cut-gate pattern 224(13) represent a corresponding cut-gate section. Initial cut-gate pattern 222(11) and supplemental cut-gate patterns 224(14) and 224(15) represent a corresponding cut-gate section. Initial cut-gate pattern 222(12) and supplemental cut-gate pattern 224(16) represent a corresponding cut-gate section.

Relative to the X-axis, each cut-gate section straddles a corresponding one of gate patterns 212(1)-212(4). Each cut-gate section indicates that any underlying portion of the corresponding gate pattern is designated for removal, with remaining portions of the gate pattern being referred to as remnant patterns. According to the effects of the cut-gate sections: remnant patterns 214(1) and 214(2) correspond to gate pattern 212(1); remnant patterns 214(3) and 214(4) correspond to gate pattern 212(2); remnant patterns 214(5) and 214(6) correspond to gate pattern 212(3); and remnant patterns 214(7) and 214(8) correspond to gate pattern 212(4).

In some embodiments, each cut-gate section (which is represented by a corresponding initial cut pattern and one or two corresponding supplemental cut-gate patterns) are not discrete but instead are one integral cut-gate pattern. In some embodiments, initial cut-gate patterns 222(1), 222(4), 222(7) and 222(10), and supplemental cut-gate patterns 224(1), 224(9) and 224(13) are not discrete but instead are one integral cut-gate pattern. In some embodiments, initial cut-gate patterns 222(2), 222(5), 222(8) and 222(11), and supplemental cut-gate patterns 224(2), 224(3), 224(6), 224(7), 224(10) 224(11), 224(14) and 224(15) are not discrete but instead are one integral cut-gate pattern. In some embodiments, initial cut-gate patterns 222(3), 222(6), 222(9) and 222(12), and supplemental cut-gate patterns 224(1), 224(12) and 224(16) are not discrete but instead are one integral cut-gate pattern.

In layout diagram 200A, initial cut-gate patterns 222(1), 222(4), 222(7) and 222(10) overlie row boundary 208(2). In some embodiments, relative to the Y-axis, initial cut-gate patterns 222(1), 222(4), 222(7) and 222(10) are substantially centered along row boundary 208(2). Initial cut-gate patterns 222(2), 222(5), 222(8) and 222(11) overlie a same corresponding row boundary 208(1). Initial cut-gate patterns 222(3), 222(6), 222(9) and 222(12) overlie a same corresponding row boundary 208(3).

Some VG patterns substantially overlie corresponding AA pattern. VG patterns 218(1) and 218(2) substantially overlie corresponding AA patterns 210(1) and 210(4). Furthermore, VG pattern 218(1) extends beyond AA pattern 210(1) towards row boundary 208(1), and VG pattern 218(2) extends beyond AA pattern 210(4) towards row boundary 208(3). Some VG patterns substantially do not overlie the corresponding AA patterns. In general, relative to the Y-axis, a VG pattern which does not overlie an AA pattern is located in the interior of the corresponding cell between the AA patterns which are closest to the row-boundaries. VG patterns 218(3) and 218(4) substantially do not overlie any of AA patterns 210(1)-210(4). VG pattern 218(3) is located in the interior of cell 206(1) between AA pattern 210(1) and 210(2). VG pattern 218(4) is located in the interior of cell 206(2) between AA pattern 210(3) and 210(4).

Figure 4A:
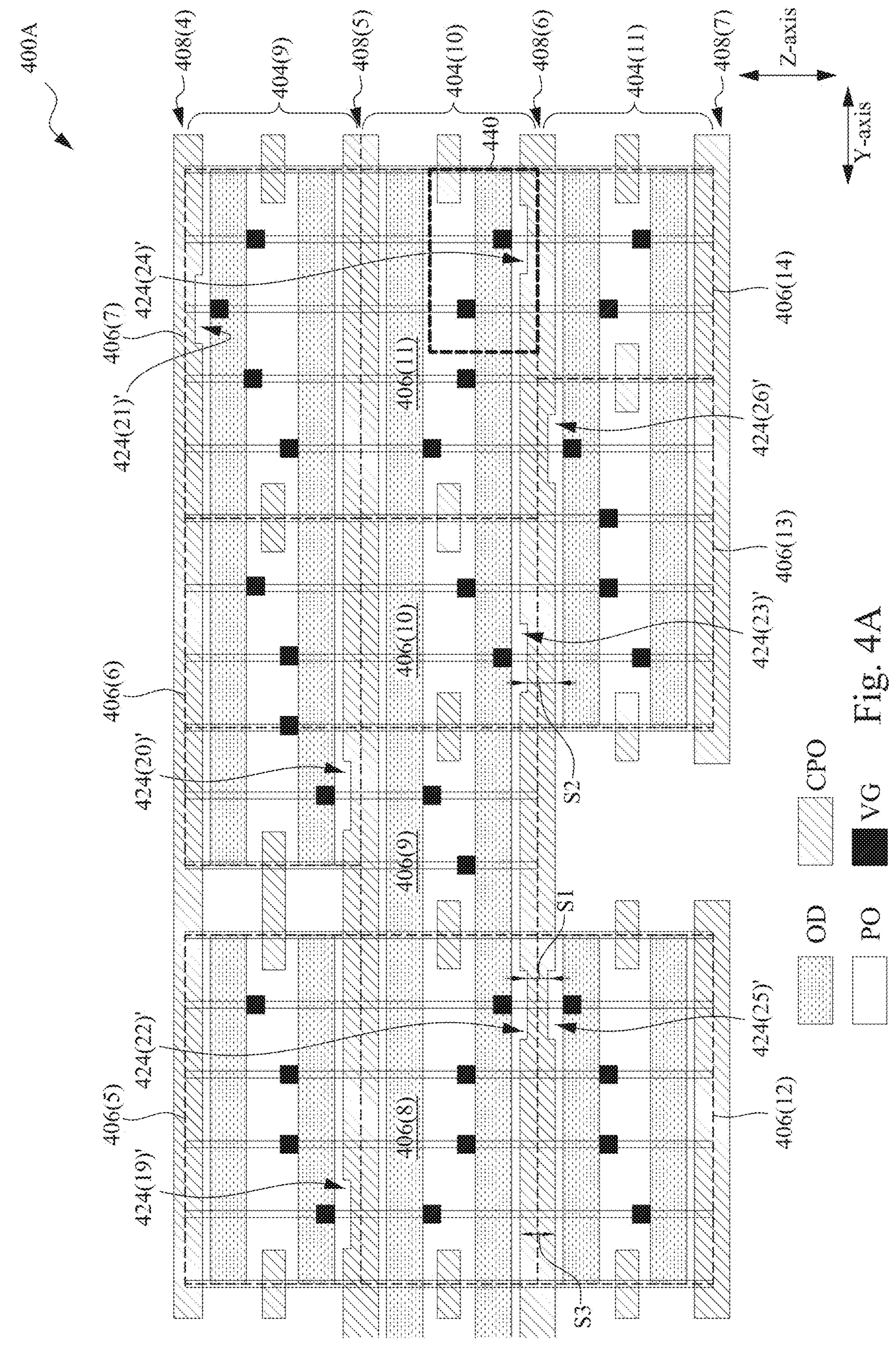
FIGS. 4A and 4B are corresponding layout diagrams, in accordance with some embodiments.
Figure 4B:
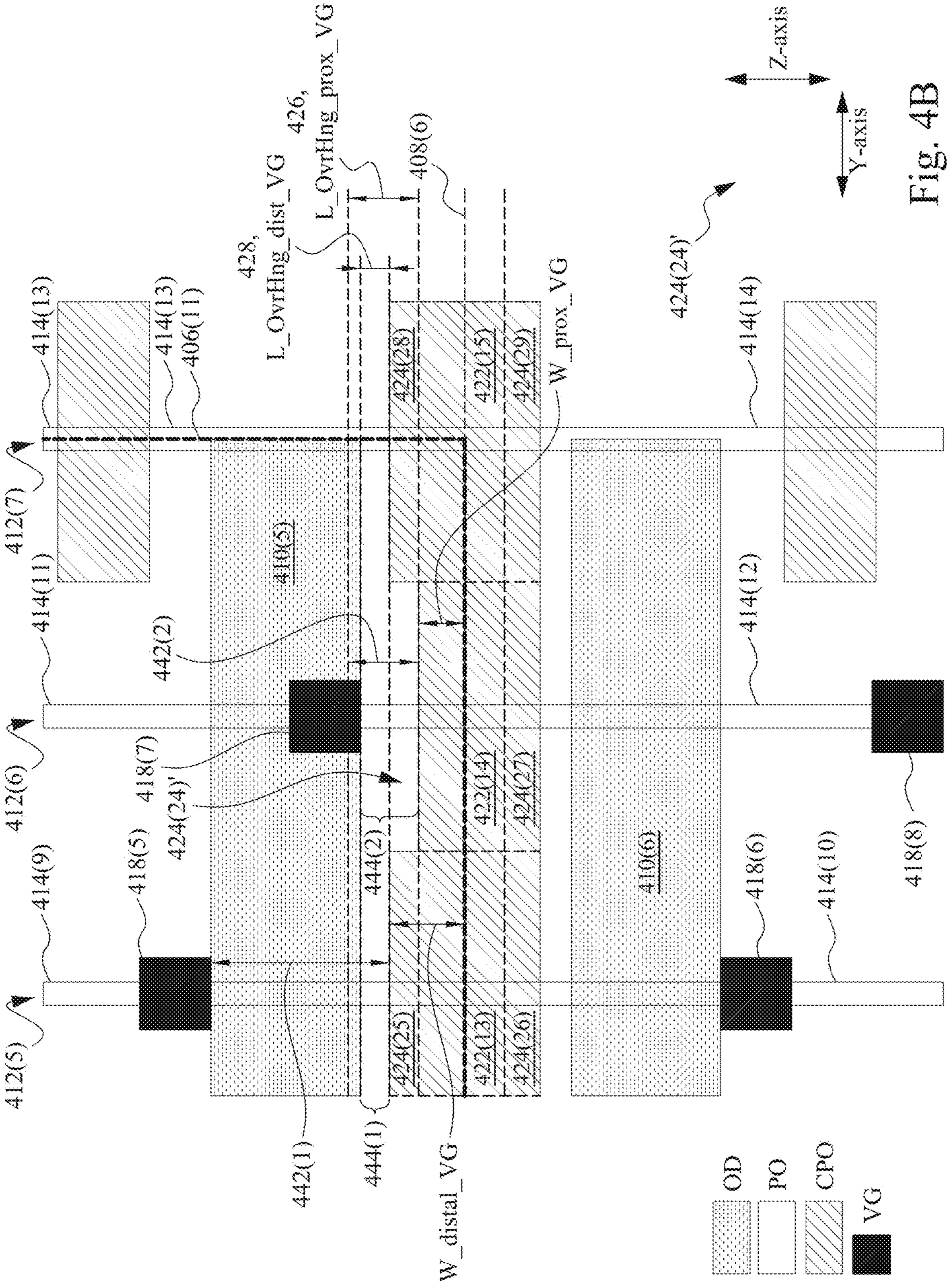

In FIG. 2A, cut-gate sections are sized in order to control the size of a stub of the remnant pattern which results as an effect of the cut-gate section, where a stub is a portion of the remnant pattern which extends beyond the corresponding AA pattern towards the corresponding row-boundary (see FIG. 4B). For example, the cut-gate section which includes initial cut-gate pattern 222(4) leaves remnant pattern 214(3), which has a stub that extends beyond AA pattern 210(1) towards row-boundary 208(1). For example, the cut-gate section which includes initial cut-gate pattern 222(7) and supplemental cut-gate pattern 224(9) leaves remnant pattern 214(5), which has a stub that extends beyond AA pattern 210(1) towards row-boundary 208(1).

In layout diagram 200A, more particularly, the sizing of the cut-gate sections takes into consideration a first design rule and a second design rule, among others. The first design rule calls for a gate pattern or a remnant pattern to extend beyond an underlying AA pattern by a first minimum-protrusion distance. In some embodiments, the first minimum-protrusion distance is determined, among other things, by the scale of the corresponding semiconductor process technology node. In FIG. 2A, the first minimum-protrusion distance is referred to as L_OvrHng_dist_VG and is called out with reference number 228 (see also FIG. 4B). The second design rule calls for a gate pattern or a remnant pattern to extend beyond an overlying VG pattern by a second minimum-protrusion distance. In some embodiments, the second minimum-protrusion distance is determined, among other things, by the scale of the corresponding semiconductor process technology node. In FIG. 2A, the second minimum-protrusion distance is referred to as L_OvrHng_prox_VG and is called out with reference number 226 (see also FIG. 4B).

In some embodiments, a ratio of first minimum-protrusion distance 228, L_OvrHng_dist_VG, to second minimum-protrusion distance 226, L_OvrHng_prox_VG, is $$\frac{\text{L\_OvrHng\_dist\_VG}}{\text{L\_OvrHng\_prox\_VG}} \approx \left(\frac{5}{9}\right).$$

In some embodiments, L_OvrHng_dist_VG is about 5 nanometers (nm), and L_OvrHng_prox_VG is about 9 nm. In some embodiments in which L_OvrHng_prox_VG is about 9 nm, a closest distance of the nearest VG pattern to the corresponding cut-gate section is about 10 nm.

As measured from the corresponding row-boundary, a distance to the edge of the corresponding cut-gate section is either W_dist_VG (see FIG. 4B) or W_prox_VG (see FIG. 4B). In some embodiments, W_dist_VG is about 0.5*CH. In some embodiments, W_dist_VG is about 0.25*CH.

In a first circumstance, a default size of the cut-gate section is adequate to ensure that each of the first and second design rules is satisfied. As used herein, in the first circumstance, a given VG pattern is located so that the default size of the corresponding cut-gate section satisfies each of the first and second design rules, and so the given VG pattern is referred to as being distal. This is because the given VG pattern is relatively distal to each of the corresponding row-boundary and the corresponding AA pattern. First minimum-protrusion distance 228, again, is referred to as L_OvrHng_dist_VG, where 'OvrHng' is an abbreviation of 'overhang,' and 'dist' is an abbreviation of 'distal.'

In a second circumstance, however, the default size of the cut-gate section is adequate to satisfy the first design rule but is not adequate to satisfy the second design rule, and accordingly the size of the cut-gate section is increased from the default size to an expanded size in order to satisfy the second design rule as well as the first design rule. As used herein, in the second circumstance, a given VG pattern is located so that the default size of the corresponding cut-gate section is not adequate to satisfy the second design rule and accordingly the size of the cut-gate section is increased from the default size to the expanded size and so the given VG pattern is referred to as being proximal. This is because the given VG pattern is relatively proximal to each of the corresponding row-boundary and the corresponding AA pattern. Second minimum-protrusion distance 226, again, is referred to as L_OvrHng_prox_VG, where 'OvrHng' is (again) an abbreviation of 'overhang,' and 'prox' is an abbreviation of 'proximal.'

In layout diagram 200A, relative to the Y-axis, the initial cut-gate patterns have the same height. In some embodiments, the initial cut-gate patterns have different corresponding heights. In layout diagram 200A, the default value for the height also satisfies a third design rule. Regarding pairs of nearest substantially collinear remnant patterns, for each pair, the third design rule calls for a minimum separation between nearest corresponding ends of the remnant patterns. In some embodiments, the minimum separation distance is determined, among other things, by the scale of the corresponding semiconductor process technology node.

In layout diagram 200A, more particularly, cut-gate sections are sized as follows. For each cut-gate section, relative to the Y-axis, and with a size of the corresponding cut-gate section being measured from row-boundary 208(2), if a distance (see 442(1) or 442(2) in FIG. 4B) from the nearest corresponding VG pattern to the corresponding initial cut-gate pattern is equal to or greater than a first reference value, then the size of the corresponding cut-gate section is increased from the default size (which is the size of the initial cut-gate pattern) to the expanded size, e.g., by enlarging the cut-gate section to include a supplemental cut-gate pattern as well as the initial cut-gate pattern. It is to be understood that the distance from the nearest corresponding VG pattern to the corresponding cut-gate section is the same as the distance from the nearest corresponding VG pattern to the end of the stub of the corresponding remnant pattern. In some embodiments, the first reference value is REF1, where REF1=0.25*CH. In general, if the VG pattern is a distal VG pattern, then the distance from the nearest corresponding VG pattern to the corresponding initial cut-gate pattern will be equal to or greater than REF1. However, if the distance from the nearest corresponding VG pattern to the corresponding initial cut-gate pattern is less than REF1, then the size of the corresponding cut-gate pattern is not increased from the default size, e.g., by keeping the cut-gate section as including the initial cut-gate pattern and not enlarging the cut-gate section to further include a supplemental cut-gate pattern.

In FIG. 2A, relative to row-boundary 208(1), VG pattern 218(1) is proximal and VG pattern 218(3) is distal. Relative to row-boundary 208(2), each of VG patterns 218(1)-218(4) is distal. Relative to row-boundary 208(3), VG pattern 218(2) is proximal and VG pattern 218(4) is distal.

Relative to row-boundary 208(1), the distance from VG pattern 218(1) to initial cut-gate pattern 222(4) is less than REF1, and so the size of the corresponding cut-gate section is not increased from the default size, e.g., otherwise by adding what would be supplemental cut-gate pattern 224(5). The absence of what otherwise would be supplemental cut-gate pattern 224(5) is noted by corresponding ghost 224(5)'.

Relative to row-boundary 208(1), the distance from VG pattern 218(3) to initial cut-gate pattern 222(7) is equal to or greater than REF1, and accordingly the size of the corresponding cut-gate section is increased from the default size by adding supplemental cut-gate pattern 224(9) so that the corresponding cut-gate section includes initial cut-gate pattern 222(7) and supplemental cut-gate pattern 224(9).

Relative to row-boundary 208(1) and relative to gate pattern 212(1), both of the first and second design rules are satisfied because there are no VG patterns over gate pattern 212(1). Accordingly the size of the corresponding cut-gate section is increased from the default size by adding supplemental cut-gate pattern 224(1) so that the corresponding cut-gate section includes initial cut-gate pattern 222(1) and supplemental cut-gate pattern 224(1).

Relative to row-boundary 208(1), and relative to gate pattern 212(4), both of the first and second design rules are satisfied because there are no VG patterns over gate pattern 212(4). Accordingly the size of the corresponding cut-gate section is increased from the default size by adding supplemental cut-gate pattern 224(13) so that the corresponding cut-gate section includes initial cut-gate pattern 222(10) and supplemental cut-gate pattern 224(13).

Accordingly, relative to row-boundary 208(1), cell 206(1) has a staggered gate-stub-size profile.

In FIG. 2A, relative to row-boundary 208(2) and cell 206(1), the distance from VG pattern 218(1) to initial cut-gate pattern 222(5) is equal to or greater than REF1, and accordingly the size of the corresponding cut-gate section is increased from the default size by adding supplemental cut-gate pattern 224(6) so that the corresponding cut-gate section includes initial cut-gate pattern 222(5) and supplemental cut-gate pattern 224(6).

Relative to row-boundary 208(2) and cell 206(1), the distance from VG pattern 218(3) to initial cut-gate pattern 222(8) is equal to or greater than REF1, and accordingly the size of the corresponding cut-gate section is increased from the default size by adding supplemental cut-gate pattern 224(10) so that the corresponding cut-gate section includes initial cut-gate pattern 222(8) and supplemental cut-gate pattern 224(10).

Relative to row-boundary 208(2) and cell 206(1), and further relative to gate pattern 212(1), both of the first and second design rules are satisfied because there are no VG patterns over gate pattern 212(1). Accordingly the size of the corresponding cut-gate section is increased from the default size by adding supplemental cut-gate pattern 224(2) so that the corresponding cut-gate section includes initial cut-gate pattern 222(2) and supplemental cut-gate pattern 224(2).

Relative to row-boundary 208(2) and cell 206(1), and further relative to gate pattern 212(4), both of the first and second design rules are satisfied because there are no VG patterns over gate pattern 212(4). Accordingly the size of the corresponding cut-gate section is increased from the default size by adding supplemental cut-gate pattern 224(14) so that the corresponding cut-gate section includes initial cut-gate pattern 222(11) and supplemental cut-gate pattern 224(14).

In FIG. 2A, relative to row-boundary 208(2) and cell 206(2), the distance from VG pattern 218(1) to initial cut-gate pattern 222(5) is equal to or greater than REF1, and accordingly the size of the corresponding cut-gate section is increased from the default size by adding supplemental cut-gate pattern 224(7) so that the corresponding cut-gate section includes initial cut-gate pattern 222(5) and supplemental cut-gate pattern 224(7).

Relative to row-boundary 208(2) and cell 206(2), the distance from VG pattern 218(3) to initial cut-gate pattern 222(8) is equal to or greater than REF1, and accordingly the size of the corresponding cut-gate section is increased from the default size by adding supplemental cut-gate pattern 224(11) so that the corresponding cut-gate section includes initial cut-gate pattern 222(8) and supplemental cut-gate pattern 224(11).

Relative to row-boundary 208(2) and cell 206(2), and further relative to gate pattern 212(1), both of the first and second design rules are satisfied because there are no VG patterns over gate pattern 212(1). Accordingly the size of the corresponding cut-gate section is increased from the default size by adding supplemental cut-gate pattern 224(3) so that the corresponding cut-gate section includes initial cut-gate pattern 222(2) and supplemental cut-gate pattern 224(3).

Relative to row-boundary 208(2) and cell 206(2), and further relative to gate pattern 212(4), both of the first and second design rules are satisfied because there are no VG patterns over gate pattern 212(4). Accordingly the size of the corresponding cut-gate section is increased from the default size by adding supplemental cut-gate pattern 224(16) so that the corresponding cut-gate section includes initial cut-gate pattern 222(12) and supplemental cut-gate pattern 224(16).

Accordingly, relative to row-boundary 208(3), cell 206(2) has a staggered gate-stub-size profile.

In FIG. 2A, relative to row-boundary 208(3), the distance from VG pattern 218(2) to initial cut-gate pattern 222(6) is less than REF1, and so the size of the corresponding cut-gate section is not increased from the default size, e.g., otherwise by adding what would be supplemental cut-gate pattern 224(8). The absence of what otherwise would be supplemental cut-gate pattern 224(8) is noted by corresponding ghost 224(8)'.

Relative to row-boundary 208(3), the distance from VG pattern 218(4) to initial cut-gate pattern 222(9) is equal to or greater than REF1, and so the size of the corresponding cut-gate section is increased from the default size by adding supplemental cut-gate pattern 224(12) so that the corresponding cut-gate section includes initial cut-gate pattern 222(9) and supplemental cut-gate pattern 224(12).

Relative to row-boundary 208(3) and relative to gate pattern 212(1), both of the first and second design rules are satisfied because there are no VG patterns over gate pattern 212(1). Accordingly the size of the corresponding cut-gate section is increased from the default size by adding supplemental cut-gate pattern 224(4) so that the corresponding cut-gate section includes initial cut-gate pattern 222(3) and supplemental cut-gate pattern 224(4).

Relative to row-boundary 208(3), and relative to gate pattern 212(4), both of the first and second design rules are satisfied because there are no VG patterns over gate pattern 212(4). Accordingly the size of the corresponding cut-gate section is increased from the default size by adding supplemental cut-gate pattern 224(16) so that the corresponding cut-gate section includes initial cut-gate pattern 222(12) and supplemental cut-gate pattern 224(16).

In some embodiments, a majority of the cut-gate sections are increased from the default size, while a minority of the cut-gate sections are preserved at the default size. In some embodiments, at least about 75% of the cut-gate sections are increased from the default size, while at most about 25% of the cut-gate sections are preserved at the default size. In some embodiments, at least about 87.5% of the cut-gate sections are increased from the default size, while at most about 12.5% of the cut-gate sections are preserved at the default size.

Depending upon the nearest corresponding VG patterns, and relative to the Y-axis, a cut-gate section can have a first size S1, a second size S2 or a third size S3. The first size S1 is equal to the initial cut-gate pattern. The second size S2 is equal to the initial cut-gate pattern plus one instance of the supplemental cut-gate pattern. The third size S3 is equal to the initial cut-gate pattern plus two instances of the supplemental cut-gate pattern. Relative to each other, $S1<S2<S3$. In some embodiments, $S1\approx 0.1*CH$. In some embodiments, $S2\approx 0.15*CH$. In some embodiments, $S3\approx 0.2*CH$.

According to another approach, each cut-gate section includes only the initial cut-gate pattern, which ensures that the each of the first and second design rules is satisfied. For each pair of nearest substantially collinear remnant patterns, a result of the other approach is that the separation between the nearest ends of the remnant patterns will be the same and have the size S1. For a given pair of gate electrodes in a semiconductor device which results from a corresponding pair of remnant patterns in a layout diagram, there is a tendency for the pair of gate electrodes to suffer crosstalk between one another, e.g., due to capacitive coupling, or the like. The tendency, or degree to which the pair of gate electrodes is likely to suffer crosstalk, is directly proportional to the amount of separation between the nearest ends of the gate electrodes. According to the other approach, each pair of substantially collinear remnant patterns will yield a corresponding pair of electrodes with substantially the same tendency to suffer crosstalk.

As compared to the other approach, an advantage of some embodiments is that the tendency to suffer crosstalk is reduced because consideration is given to whether the VG pattern is proximal or distal relative to the corresponding row-boundary and the corresponding AA pattern. For some embodiments, as a result, for a given pair of nearest substantially collinear remnant patterns, the separation between the nearest ends of the remnant patterns is one of three possible sizes because the corresponding cut-gate section has one of three possible sizes, S1, S2 or S3. Further according to some embodiments, at most about 25% of remnant pattern pairs have a separation distance of S1, which about 75% of the remnant pattern pairs have a separation distance of S2 or S3.

FIG. 2B is layout diagram 200B, in accordance with some embodiments.

In some embodiments, layout diagram 200B of FIG. 2B is stored on a non-transitory computer-readable medium (see FIG. 7).

As compared to layout diagram 200A of FIG. 2A, layout diagram 200B of FIG. 2B is more complicated. In particular, layout diagram 200B includes cells 206(3) and 206(4). Cells 206(3) and 206(4) are combined to represent a two input NAND (ND2) gate. In some embodiments, relative to a unit of current-driving capacity, D, the NAND gate of layout diagram 200B has a current-driving capacity of D, such that layout diagram 200B represents an ND2D1 logical gate.

Similar to layout diagram 200A, some cut-gate sections of layout diagram 200B do not include what otherwise would be a supplemental cut-gate pattern. In particular, layout diagram 200B does not include what otherwise would be supplemental cut-gate patterns 224(17) and 224(18), and their absence is noted by corresponding ghosts 224(17)' and 224(18)'.

FIGS. 3A, 3B, 3C and 3D are corresponding cross-sectional views 300A, 300B, 300C and 300D, in accordance with some embodiments.

More particularly, FIGS. 3A-3D are corresponding cross-sectional views 300A-300D of semiconductor devices fabricated according to layout diagram 200A of FIG. 2A. Cross-sectional views 300A-300C correspond to straight section line IIIA/B/C-IIIA/B/C' in FIG. 2A. Cross-sectional view 300D corresponds to folded section line IIID-IIID' in FIG. 2A.

Figure 3A:
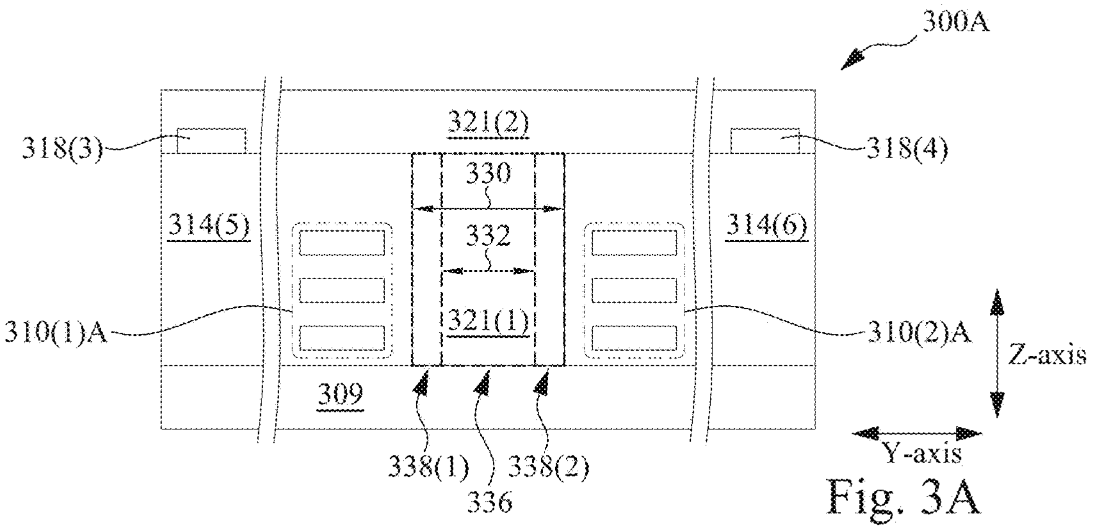
FIGS. 3A, 3B, 3C and 3D are corresponding cross-sectional views, in accordance with some embodiments.

FIGS. 3A-3D follows a similar numbering scheme to that of FIG. 2A. Though corresponding, some components also differ. To help identify components which correspond but nevertheless have differences, the numbering convention uses 3-series numbers for FIGS. 3A-3D while FIG. 2A uses 2-series numbers. For example, item 310(1)A in FIG. 3A is an active region and corresponding item 210(1) in FIG. 2A is an AA pattern, and wherein: similarities are reflected in the common root _10(1); and differences are reflected in the corresponding leading digit 3__(_) in FIGS. 3A-3D and 2__(_) in FIG. 2A, and in the alphabetic suffix, e.g., ___(_) A, in FIG. 2A. For brevity, the discussion will focus more on differences between FIGS. 3A-3D and FIG. 2A than on similarities.

Figure 3B:
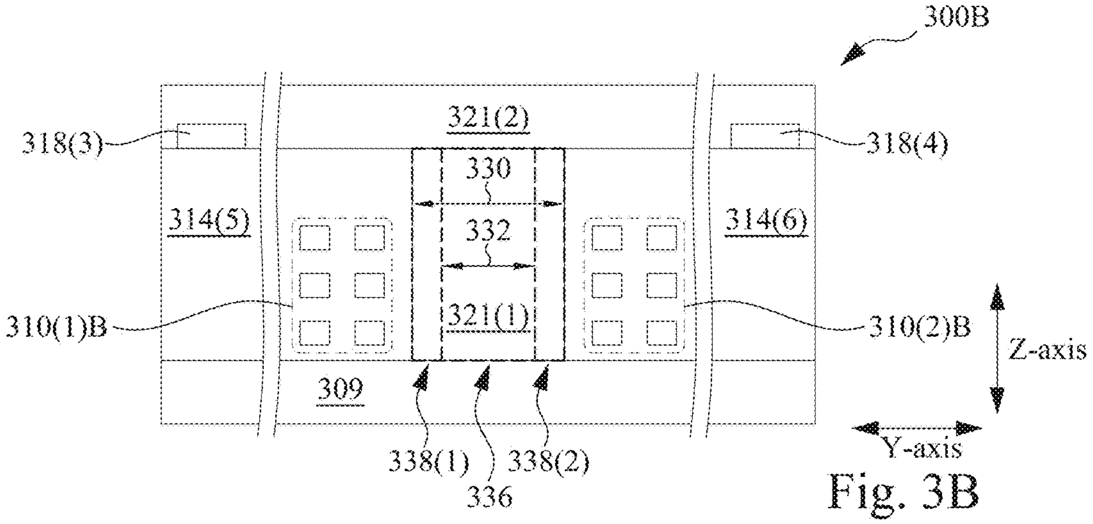
Figure 3C:
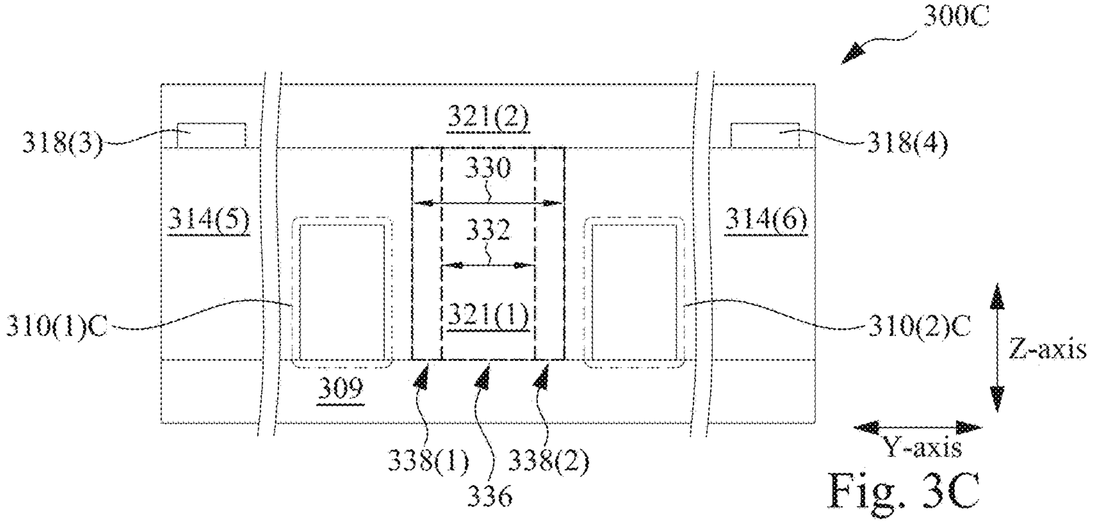

FIG. 3A includes active regions 310(1)A and 310(2)A. FIG. 3B includes active regions 310(1)B and 310(2)B. FIG. 3C includes active regions 310(1)C and 310(2)C.

Each of FIGS. 3A-3C further: includes: a substrate 309; gate electrodes 314(5) and 314(6); dielectric material 321(2) interposed around and between gate electrodes 314(5) and 314(6); VG structures 318(3) and 318(4); and dielectric material 321(2) interposed around and between VG structures 318(3) and 318(4).

In FIG. 3A, active regions 310(1)A and 310(2)A are configured as nano sheets. In FIG. 3B, active regions 310(1)B and 310(2)B are configured as nano wires. In FIG. 3C, active regions 310(1)C and 310(2)C are configured as fins.

In each of FIGS. 3A-3C, gate electrodes 314(5) and 314(6) are separated by a distance 330 corresponding to a size of the cut-gate section which is a combination of initial cut-gate pattern 222(8), supplemental cut-gate pattern 224(10) and supplemental cut-gate pattern 224(11). As such, distance 330 is S3. In terms of relative improvement in separation distance, distance 332 is noted in each of FIGS. 3A-3C, which otherwise corresponds to a cut-gate section which includes only initial cut-gate pattern 222(8). As such, distance 332 is S1.

Figure 3D:
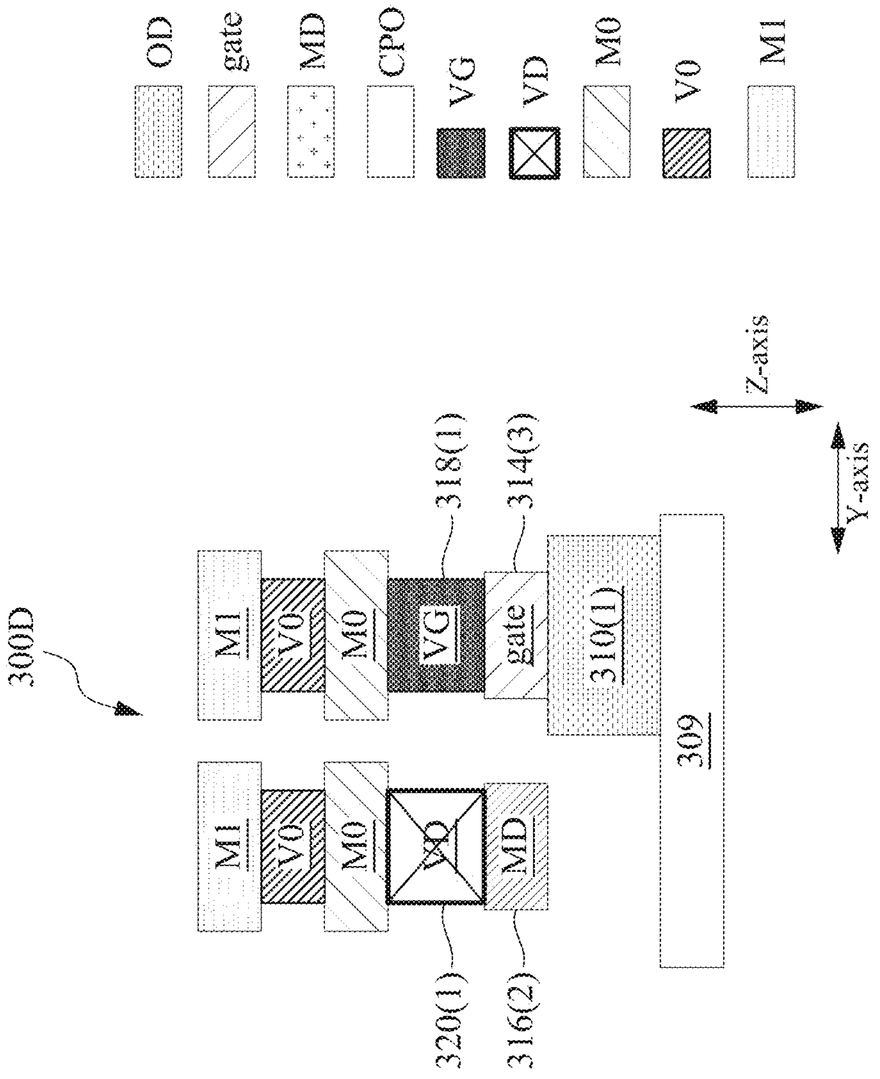

FIG. 3D includes: substrate 309; active region 310(1)A; MD structure 316(2); gate electrode 314(3); VD structure 320(1); VG structure 318(1); conductive segments in a first metallization layer (M_1st layer) correspondingly over VD structure 320(1) and VG structure 318(1); via structures in a first interconnection layer (VIA_1st layer) correspondingly over the conductive segments in the M_1st layer; and conductive segments in a second metallization layer (M_2nd layer) correspondingly over the via structures in the VIA_1st layer.

FIG. 3D assumes a numbering convention of the corresponding design rules of the corresponding semiconductor process technology node which begins with the M_1st layer being referred to as M(0), and the VIA_1st layer being referred to as VIA0. Alternatively, the numbering convention could begin with M_1st layer being referred to as M(1), and the VIA_1st layer being referred to as VIA1.

Figure 4C:
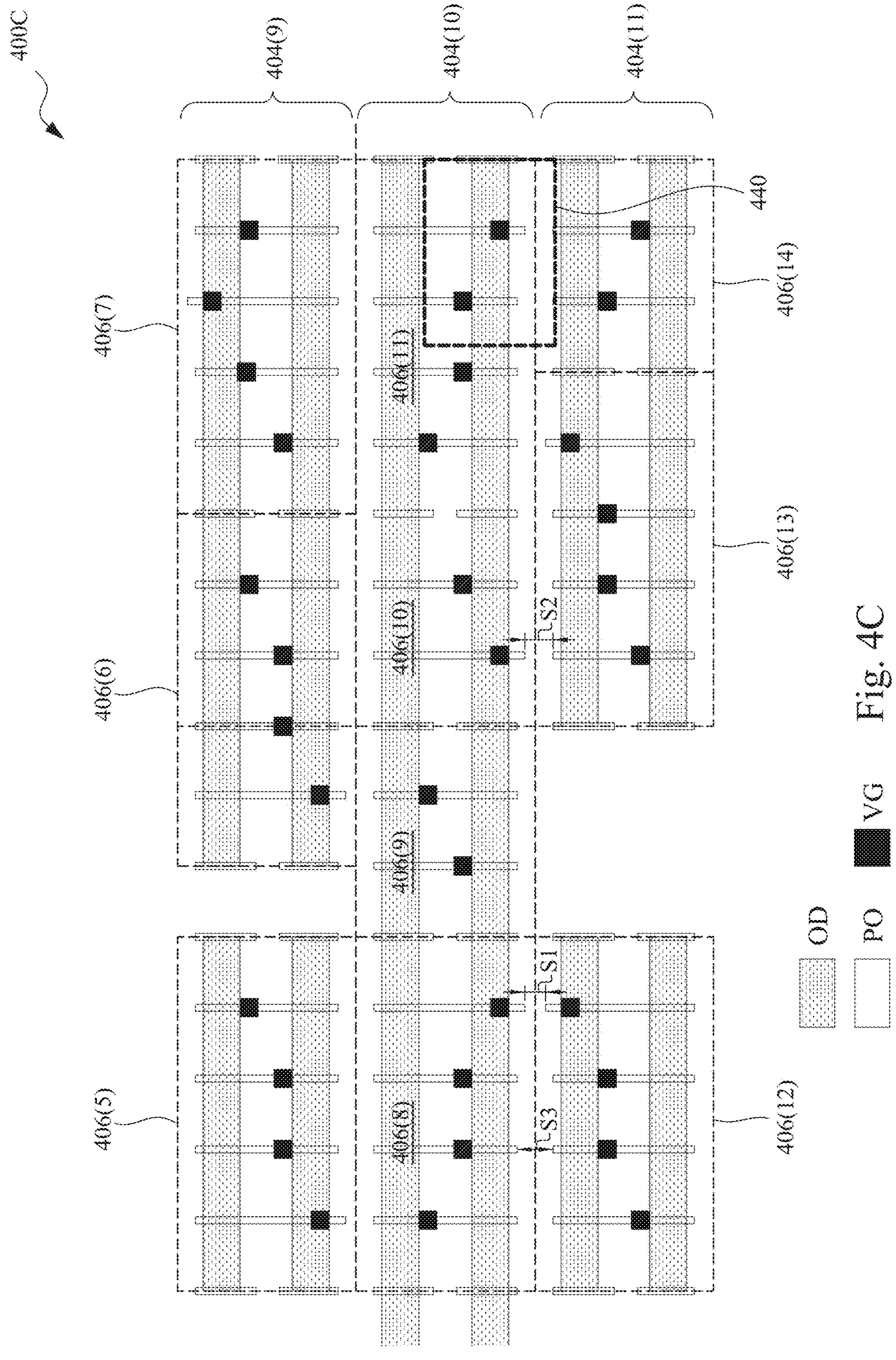
FIG. 4C is a structural diagram of a semiconductor device 400C, in accordance with some embodiments.

FIGS. 4A and 4B are corresponding layout diagrams 400A and 440', in accordance with some embodiments. FIG. 4C is a structural diagram of a semiconductor device 400C, in accordance with some embodiments.

FIGS. 4A-4C follow a similar numbering scheme to that of FIGS. 2A-2B. Though corresponding, some components also differ. To help identify components which correspond but nevertheless have differences, the numbering convention uses 4-series numbers for FIGS. 4A-4C while FIGS. 2A-2B use 2-series numbers. For example, item 406(5) in FIG. 4A is a cell, and item 206(1) in FIG. 2A is a cell, and wherein: similarities are reflected in the common root _06( ); and differences are reflected in the corresponding leading digit 4__(_) in FIGS. 4A-4C and 2__(_) in FIGS. 2A-2B, and in the numeral within the corresponding parenthetical, e.g., ___(5) in FIG. 2A and ___(1) in FIG. 2A. For brevity, the discussion will focus more on differences between FIGS. 4A-4C and FIGS. 2A-2B than on similarities.

Layout diagram 400A is arranged into rows 404(9), 404(10) and 404(11). Rows 404(9) and 404(10) share row-boundary 408(5). Rows 404(10) and 404(11) share row-boundary 408(6). Row 404(9) shares row-boundary 408(4) with a row which is not shown in FIG. 4A. Row 404(11) shares row-boundary 408(7) with a row which is not shown in FIG. 4A.

Layout diagram 400A includes cells 406(5), 406(6), 406(7), 406(8), 406(9), 406(10), 406(11), 406(12), 406(13) and 406(14). Layout diagram 400A further includes AA patterns, gate patterns, VG patterns, and cut-gate sections, none of which is called out with a reference number (for simplicity of illustration and brevity of description). Each cut-gate section includes an initial cut-gate pattern. Some cut-gate sections further include one supplemental cut-gate pattern. And some cut-gate sections further include two supplemental cut-gate patterns. None of the initial cut-gate patterns nor the supplemental cut-gate patterns is called out with a reference number (for simplicity of illustration and brevity of description).

In FIG. 4A, a majority of the cut-gate sections include an initial cut-gate pattern and two supplemental cut-gate patterns. A minority of the cut-gate sections include an initial cut-gate pattern and at least one supplemental cut-gate pattern.

More particularly, in FIG. 4A, about 75% of the cut-gate sections include an initial cut-gate pattern and two supplemental cut-gate patterns in FIG. 4A. About 25% of the cut-gate sections include an initial cut-gate pattern and at least one supplemental cut-gate pattern. Yet more particularly, in FIG. 4A, about 12.5% of the cut-gate sections include an initial cut-gate pattern and one supplemental cut-gate pattern, and about 12.5% of the cut-gate sections include an initial cut-gate pattern and two supplemental cut-gate patterns.

While none of the supplemental cut-gate patterns is called out with a reference number in FIG. 4A, the absences of the supplemental cut-gate patterns are called out with corresponding ghosts 424(19)', 424(20)', 424(21)', 424(22)', 424(23)', 424(24)', 424(25)' and 424(26)'.

Accordingly, relative to row-boundary 408(4), cell 406(7) has a staggered gate-stub-size profile. Accordingly, relative to row-boundary 408(5), each of cells 406(5) and 406(6) has a staggered gate-stub-size profile. Accordingly, relative to row-boundary 408(6), each of cells 406(8), 406(10), 406 (11), 406(12) and 406(13) has a staggered gate-stub-size profile.

In FIG. 4A, an area is called out with reference number 440'. A zoomed-in view of area 440 is provided in FIG. 4B.

In FIG. 4B, layout diagram 440' is a zoomed-in view of area 440 of FIG. 4A.

Layout diagram 440' includes: AA patterns 410(5) and 410(6); gate patterns 412(5), 412(6) and 412(7); VG patterns 418(5), 418(6), 418(7) and 418(8); cut-gate sections; and remnant patterns 414(9), 414(10), 414(11), 414(12), 414(13) and 414(14).

A first one of the cut-gate sections includes initial cut-gate pattern 422(13) and supplemental cut-gate patterns 424(25) and 424(26). A second one of the cut-gate sections includes initial cut-gate pattern 422(14) and supplemental cut-gate pattern 424(27). A third one of the cut-gate sections includes initial cut-gate pattern 422(15) and supplemental cut-gate patterns 424(28) and 424(29).

In FIG. 4B, each of VG patterns 418(5), 418(6) and 418(8) is a distal VG pattern. A distance from VG pattern 418(5) to the corresponding cut-gate section is called out with reference number 442(1). VG pattern 418(7) is a proximal VG pattern. A distance from VG pattern 418(7) to the corresponding cut-gate section is called out with reference number 442(2).

Each of remnant patterns 414(9)-414(14) has a corresponding stub, of which only two are numbered for simplicity of illustration, namely stub 444(1) of remnant pattern 414(9) and stub 444(2) of remnant pattern 414(11). Again, a stub is a portion of the remnant pattern which extends beyond corresponding AA 410(5) or 410(6) pattern towards corresponding row-boundary 408(6).

Stub 444(1) has a length which is first minimum-protrusion distance 428, L_OvrHng_dist_VG, and which also represents a gap of the same size between AA pattern 410(5) and supplemental cut-gate pattern 424(25). Stub 444(2) has a length which is second minimum-protrusion distance 426, L_OvrHng_prox_VG, and which also represents a gap of the same size between AA pattern 410(5) and initial cut-gate pattern 422(14).

Again, FIG. 4C is a structural diagram of a semiconductor device 400C which is based on layout diagrams 400A and 440' of corresponding FIGS. 4A & 4B. Hence, layout diagrams 400A and 440' are representative of semiconductor device 400C. Patterns in layout diagrams 400A and 440' represent corresponding structures in semiconductor device 400C. For simplicity of discussion, elements in semiconductor device 400A will use the item numbers of layout diagram 400A. In particular, item numbers 406(5)-406(14) in FIG. 4C represent corresponding cell regions, though item numbers 406(5)-405(14) represent corresponding cells in layout diagram 400A.

Figure 5:
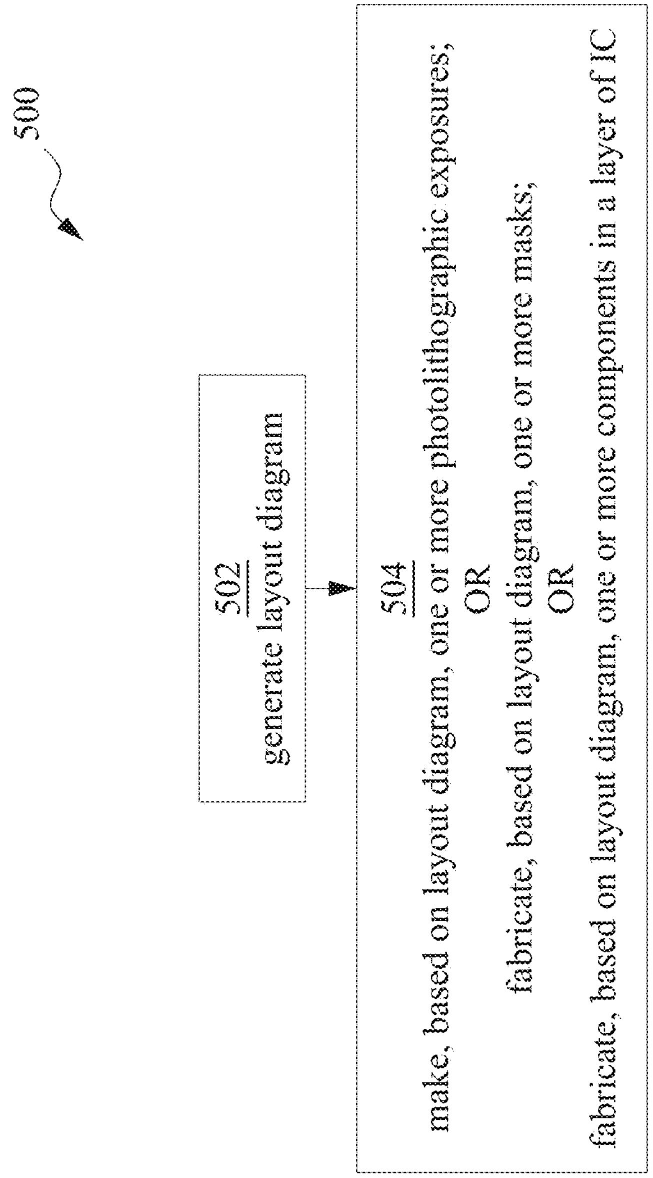
FIG. 5 is a flowchart of a method of manufacturing a semiconductor device, in accordance with some embodiments.

FIG. 5 is a flowchart of a method 500 of manufacturing a semiconductor device, in accordance with some embodiments.

Method 500 is implementable, for example, using EDA system 700 (FIG. 7, discussed below) and an integrated circuit (IC) manufacturing system 800 (FIG. 8, discussed below), in accordance with some embodiments. Examples of a semiconductor device which can be manufactured according to method 500 include semiconductor device 100 in FIG. 1.

In FIG. 5, method 500 includes blocks 502-504. At block 502, a layout diagram is generated which, among other things, includes one or more of layout diagrams disclosed herein, or the like. Block 502 is implementable, for example, using EDA system 700 (FIG. 7, discussed below), in accordance with some embodiments. Block 502 is discussed in more detail below with respect to FIGS. 6A-6B. From block 502, flow proceeds to block 504.

At block 504, based on the layout diagram, at least one of (A) one or more photolithographic exposures are made or (B) one or more semiconductor masks are fabricated or (C) one or more components in a layer of a semiconductor device are fabricated. See discussion below of FIG. 8.

Figure 6A:
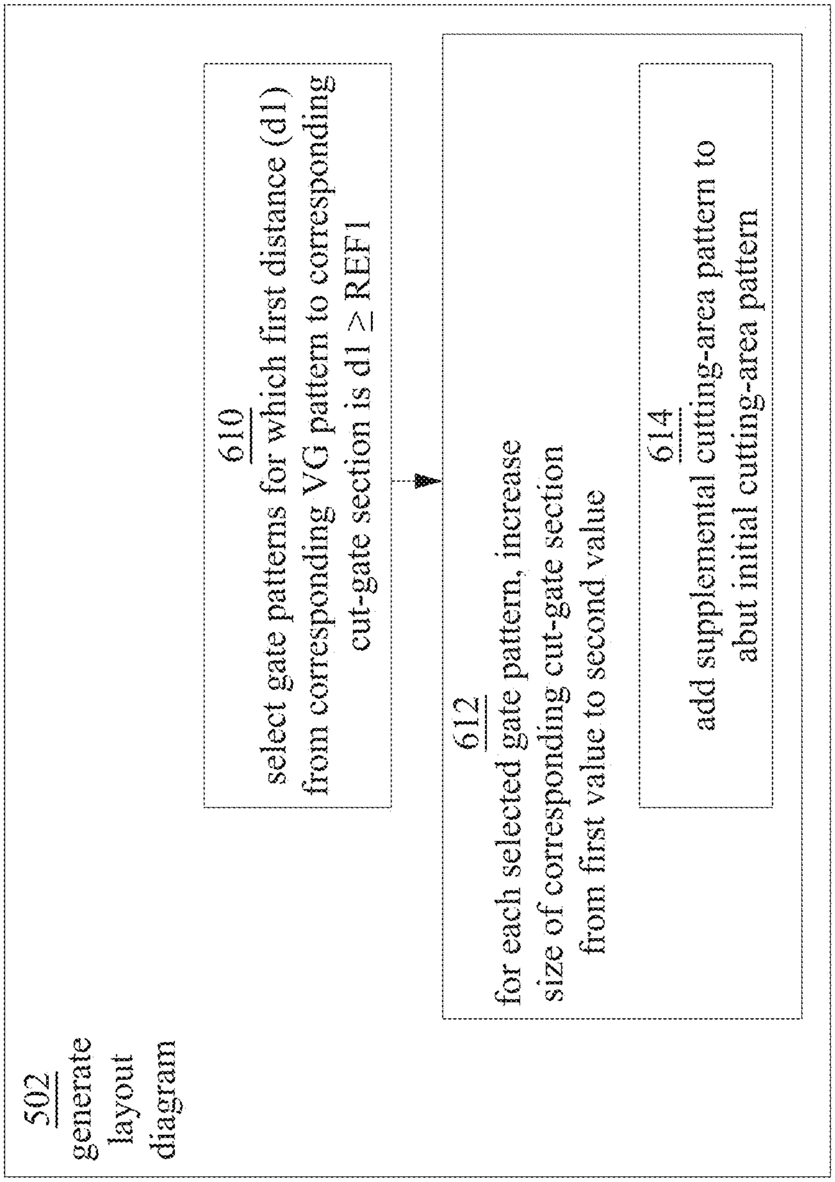
FIGS. 6A-6B are corresponding flowcharts of methods of manufacturing a semiconductor device, in accordance with some embodiments.

FIG. 6A is a flowchart of a method of generating a layout diagram, in accordance with some embodiments.

More particularly, the flowchart of FIG. 6A shows additional blocks included in block 502 of FIG. 5, in accordance with one or more embodiments. In FIG. 6A, block 502 includes blocks 610-614.

At block 610, gate patterns are selected for which a condition is true, namely that a first distance, d1, from a corresponding VG pattern to a corresponding cut-gate section is d1≥REF1. Examples of gate patterns for which the condition is true include gate pattern 212(3) in FIG. 2A and gate pattern 412(5) in FIG. 4B, and more particularly: the portion of gate pattern 212(3) which overlies AA pattern 210(2) and which extends towards row-boundary 208(2); the portion of gate pattern 212(3) which overlies AA pattern 210(3) and which extends towards row-boundary 208(2); and the portion of gate pattern 412(5) which overlies AA pattern 410(5) and which extends towards row-boundary 408(6). From block 610, flow proceeds to block 612.

At block 612, for each selected gate pattern, the size of the corresponding cut-gate section is increased from a first value to a second value, wherein the size of the corresponding cut-gate section is measured from the corresponding row boundary. For the examples of the selected gate patterns noted in the discussion of block 610, the corresponding cut-gate sections are the cut-gate section which includes initial cut-gate pattern 222(5) in FIG. 2A and the cut-gate section which includes initial cut-gate pattern 422(13) in FIG. 4B.

At block 614, the size of the corresponding cut-gate section is increased from a first value to the second value by adding a supplemental cutting-area pattern to abut an initial cutting-area pattern. Again, as measured from the corresponding row boundary, the first value is W_prox_VG, and the second value is W_dist_VG. Block 612 includes block 614. Examples of the initial cutter-area pattern are initial cut-gate pattern 222(5) in FIG. 2A and initial cut-gate pattern 422(13) in FIG. 4B. Examples of the supplemental cutter-area patterns are supplemental cut-gate pattern 224(6) in FIG. 2A and supplemental cut-gate pattern 424(25) in FIG. 4B.

The flowchart of FIG. 6A represents a 'selective expansion' technique in which cut-gate sections are selectively expanded. An alternative is an 'expand all, revert some' technique, which is represented by FIG. 6B.

Figure 6B:
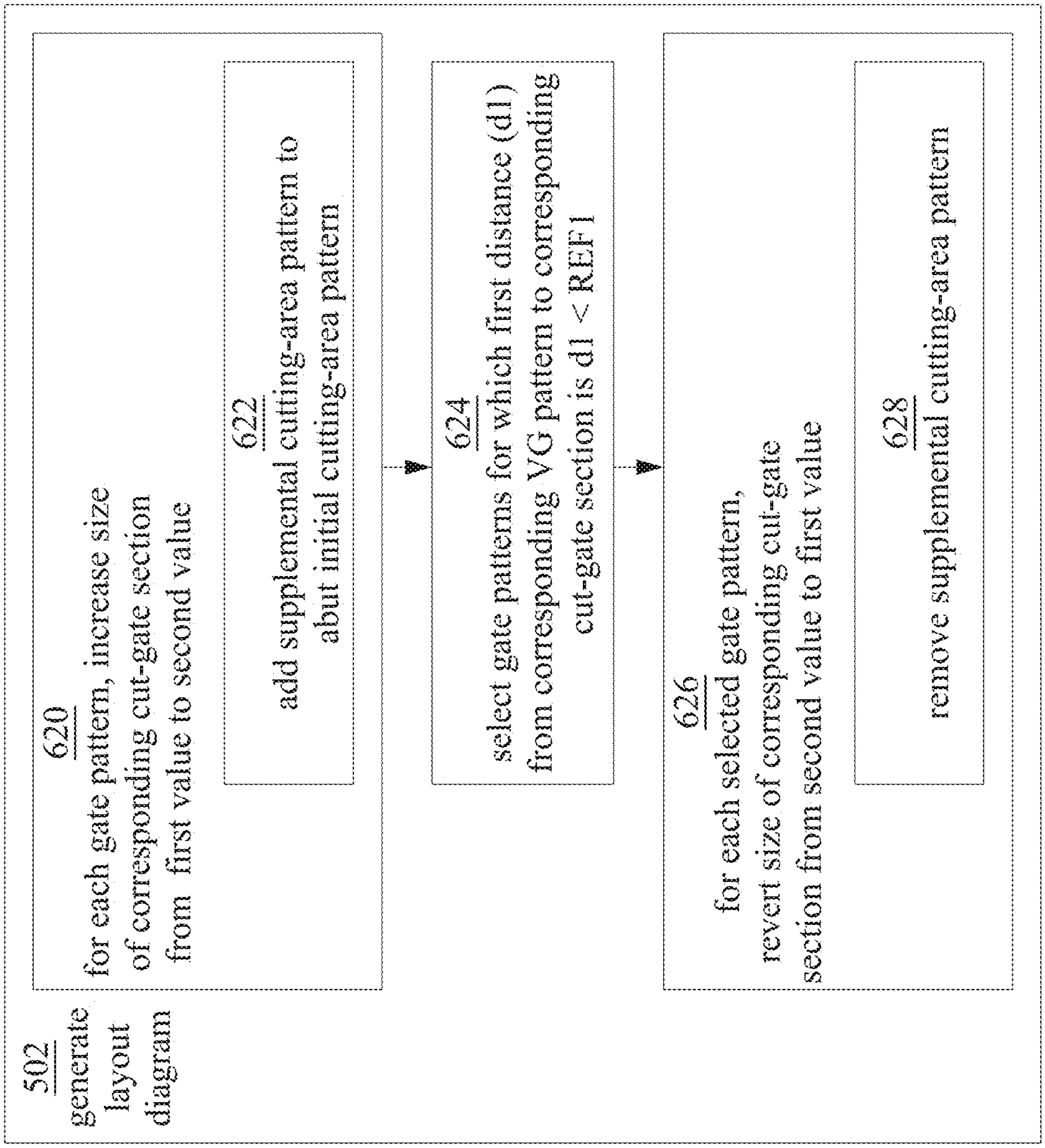

FIG. 6B is a flowchart of a method of generating a layout diagram, in accordance with some embodiments.

More particularly, the flowchart of FIG. 6B shows additional blocks included in block 502 of FIG. 5, in accordance with one or more embodiments. In FIG. 6B, block 502 includes blocks 620-628.

At block 620, the size of each cut-gate section is increased from a first value to a second value, wherein the size of the corresponding cut-gate section is measured from the corresponding row boundary.

Examples of gate patterns for which the corresponding cut-gate section is increased in size from the first value to the second value include gate patterns 212(2) and 212(3) in FIG. 2A and gate patterns 412(5) and 412(6) in FIG. 4B, and more particularly: the portion of gate pattern 212(2) which overlies AA pattern 210(1) and which extends towards row-boundary 208(1); the portion of gate pattern 212(2) which overlies AA pattern 210(2) and which extends towards row-boundary 208(2); the portion of gate pattern 212(2) which overlies AA pattern 210(3) and which extends towards row-boundary 208(2); the portion of gate pattern 212(3) which overlies AA pattern 210(1) and which extends towards row-boundary 208(1); the portion of gate pattern 212(3) which overlies AA pattern 210(2) and which extends towards row-boundary 208(2); the portion of gate pattern 212(3) which overlies AA pattern 210(3) and which extends towards row-boundary 208(2); the portion of gate pattern 412(5) which overlies AA pattern 410(5) and which extends towards row-boundary 408(6); the portion of gate pattern 412(5) which overlies AA pattern 410(6) and which extends towards row-boundary 408(6); the portion of gate pattern 412(6) which overlies AA pattern 410(5) and which extends towards row-boundary 408(6); and the portion of gate pattern 412(6) which overlies AA pattern 410(6) and which extends towards row-boundary 408(6). The corresponding cut-gate sections are the cut-gate section which includes initial cut-gate pattern 222(5) in FIG. 2A, the cut-gate section which includes initial cut-gate pattern 222(8) in FIG. 2A, the cut-gate section which includes initial cut-gate pattern 422(13) in FIG. 4B, and the cut-gate section which includes initial cut-gate pattern 422(14) in FIG. 4B. Block 620 includes block 622.

At block 622, the size of the corresponding cut-gate section is increased from a first value to the second value by adding a supplemental cutting-area pattern to abut an initial cutting-area pattern. Again, as measured from the corresponding row boundary, the first value is W_prox_VG, and the second value is W_dist_VG. Examples of the initial cutter-area pattern are initial cut-gate patterns 222(5) and 222(8) in FIG. 2A and initial cut-gate patterns 422(13) and 422(14) in FIG. 4B. Examples of the supplemental cutter-area patterns are supplemental cut-gate patterns 224(6), 224(7), 224(10) and 224(11) in FIG. 2A as well as what otherwise would correspond to supplemental cut-gate pattern 224(5) but instead is shown as ghost 224(5)' in FIG. 2A, and supplemental cut-gate patterns 424(25), 424(26) and 424(27) in FIG. 4B as well as what otherwise would correspond to supplemental cut-gate pattern 424(24) but instead is shown as ghost 424(24)' in FIG. 4B. From block 622, flow exits block 620. From block 620, flow proceeds to block 624.

At block 624, gate patterns are selected for which a condition is true, namely that a first distance, d1, from a corresponding VG pattern to a corresponding cut-gate section is d1<REF1. Examples of gate patterns for which the condition is true include gate pattern 212(2) in FIG. 2A and gate pattern 412(6) in FIG. 4B, and more particularly: the portion of gate pattern 212(2) which overlies AA pattern 210(1) and which extends towards row-boundary 208(1); and the portion of gate pattern 412(6) which overlies AA pattern 410(5) and which extends towards row-boundary 408(6). From block 624, flow proceeds to block 626.

At block 626, for each selected gate pattern, the size of the corresponding cut-gate section is reverted from the second value to the first value, wherein (again) the size of the corresponding cut-gate section is measured from the corresponding row boundary. For the examples of the selected gate patterns noted in the discussion of block 624, the corresponding cut-gate sections are the cut-gate section which includes initial cut-gate pattern 222(4) in FIG. 2A and the cut-gate section which includes initial cut-gate pattern 422(14) in FIG. 4B. Again, as measured from the corresponding row boundary, the first value is W_prox_VG, and the second value is W_dist_VG. Block 626 includes block 628.

At block 628, the size of the corresponding cut-gate section is reverted from the second value to the first value by removing a supplemental cutting-area pattern. Examples of the initial cutter-area pattern are initial cut-gate pattern 222(4) in FIG. 2A and initial cut-gate pattern 422(14) in FIG. 4B. Examples of the supplemental cutter-area patterns which are removed are what otherwise would be supplemental cut-gate pattern 224(5) but which is shown instead as ghost 224(5)' in FIG. 2A, and what otherwise would be supplemental cut-gate pattern 424(24) but which is show instead as ghost 424(24)' in FIG. 4B.

FIG. 7 is a block diagram of an electronic design automation (EDA) system 700, in accordance with some embodiments.

In some embodiments, EDA system 700 includes an APR system. Methods described herein of designing layout diagrams represent wire routing arrangements, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of the methods described herein in accordance with one or more embodiments (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells as disclosed herein. In one or more embodiments, storage medium 704 stores one or more layout diagrams 709 corresponding to one or more layouts disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
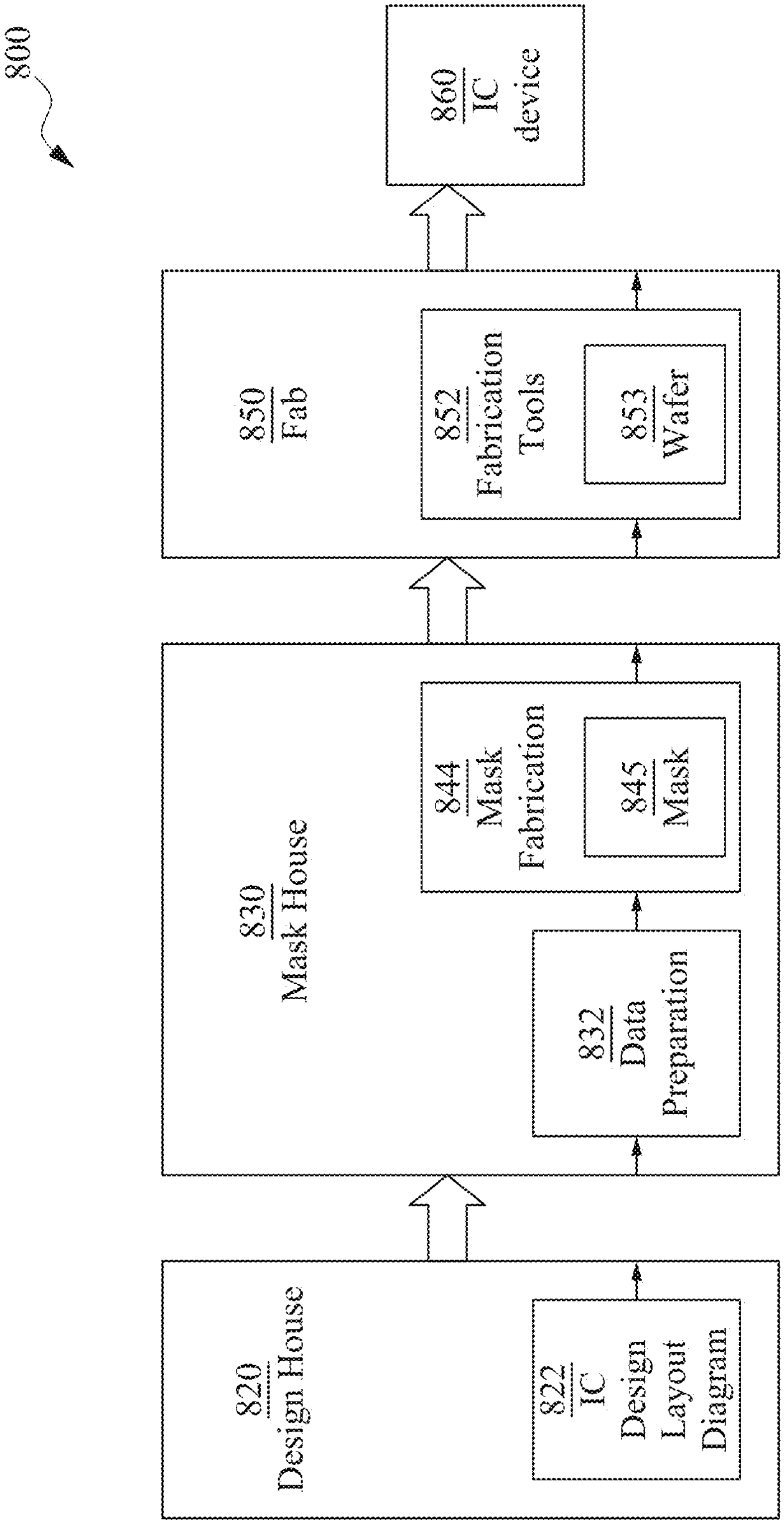
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes mask data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, mask data preparation 832 includes additional features such as a logic operation (LOP) to modify the IC design layout diagram 822 according to manufacturing rules. Additionally, the processes applied to IC design layout diagram 822 during mask data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multilevel interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method (of manufacturing a semiconductor device for which a corresponding layout diagram is stored on a non-transitory computer-readable medium, the layout diagram including active area patterns extending in a first direction, gate patterns extending in a second direction perpendicular to the first direction and overlying corresponding ones of the active area patterns, and via-to-gate (VG) patterns overlying corresponding ones of the gate patterns) includes generating the layout diagram including: regarding first and second ones of the active area patterns which (1) are correspondingly nearest to a boundary between, and (2) are correspondingly in, first and second abutting cells, and for each of the gate patterns that intersects the first or second active area pattern, selecting ones among the gate patterns for which a first distance from a nearest corresponding VG pattern to a corresponding cut-gate section is equal to or greater than a first reference value relative to the second direction; and for each of the selected gate patterns, relative to a first size, setting a size of a corresponding cut-gate section to a second size; the first size otherwise resulting in an overhang of a remnant portion of the gate pattern extending towards the boundary by a first length; and the second size resulting in the overhang extending towards the boundary by a second length smaller than the first length.

In some embodiments, the second length is a minimal permissible amount of overhang of the remnant portion.

In some embodiments, the method further includes: based on the layout diagram, at least one of: (A) making one or more photolithographic exposure; (B) fabricating one or more semiconductor masks; or (C) fabricating at least one component in a layer of a semiconductor integrated circuit.

In some embodiments, each cut-gate section includes an initial cutting-area pattern; and relative to the second direction, the setting includes: adding a supplemental cutting-area pattern to abut the initial cutting-area pattern which thereby increases the size of the corresponding cut-gate section to the second value.

In some embodiments, relative to the second direction: the first size results in a first gap between the cut-gate section and the corresponding one of the first and second active area patterns; the second size results in a second gap between the cut-gate section and the corresponding one of the first and second active area patterns; and a size of the second gap is about 5/9 of a size of the first gap.

In some embodiments, the size of the second gap is about 5 nanometers (nm) and the size of the first gap is about 9 nm.

In some embodiments, relative to the second direction, a height of each cell is CH; and as measured from the boundary, the second size is about 0.05*CH.

In some embodiments, as measured from the boundary, the first size is about 0.1*CH.

In some embodiments, relative to the second direction: the first size results in a first gap between the cut-gate section and the corresponding one of the first and second active area patterns; relative to the second direction, a height of each cell is CH; and the first gap is about 0.01*CH.

In some embodiments, relative to the second direction: the second size results in a second gap between the cut-gate section and the corresponding one of the first and second active area patterns; and the second gap is about 0.25*CH.

In some embodiments, for a majority of the intersecting gate patterns, the size is increased to the second size; and for a minority of the intersecting gate patterns, the size is the first value.

In some embodiments, for at least about 75% of the intersecting gate patterns, the size is set to the second size; and for at most about 25% of the intersecting gate patterns, the size remains at the first value.

In some embodiments, for about 87.5% of the intersecting gate patterns, the size the size is set to the second size.

In some embodiments, for each of the selected gate patterns, the corresponding VG pattern substantially does not overlap the corresponding first or second active area pattern.

In some embodiments, for each of the gate patterns which are not selected, the corresponding VG pattern substantially overlaps the corresponding first or second active area pattern.

In some embodiments, a method (of manufacturing a semiconductor device for which a corresponding layout diagram is stored on a non-transitory computer-readable medium, the layout diagram including active area patterns extending in a first direction, gate patterns extending in a second direction perpendicular to the first direction and overlying corresponding ones of the active area patterns, and via-to-gate (VG) patterns overlying corresponding ones of the gate patterns) includes generating the layout diagram including: regarding first and second ones of the active area patterns which (1) are correspondingly nearest to a boundary between, and (2) are correspondingly in, first and second abutting cells, and for each of the gate patterns that intersects the first or second active area pattern: relative to a first size, setting a size of a corresponding cut-gate section to a second size; the first size otherwise resulting in an overhang of a remnant portion of the gate pattern extending towards the boundary by a first length; and the second size resulting in the overhang extending towards the boundary by a second length smaller than the first length; and selecting ones among the gate patterns for which a first distance from a nearest corresponding VG pattern to the corresponding cut-gate section is than a first reference value less than a first reference value relative to the second direction; and for each of the selected gate patterns, reducing the size of the corresponding cut-gate section from the second size to the first size.

In some embodiments, the second length is a minimal permissible amount of overhang of the remnant portion.

In some embodiments, the method further includes: based on the layout diagram, at least one of: (A) making one or more photolithographic exposure; (B) fabricating one or more semiconductor masks; or (C) fabricating at least one component in a layer of a semiconductor integrated circuit.

In some embodiments, each cut-gate section includes an initial cutting-area pattern; and the setting includes adding a supplemental cutting-area pattern to abut the initial cutting-area pattern which thereby increases the size of the corresponding cut-gate section to the second value.

In some embodiments, the reducing includes: removing the supplemental cutting-area pattern to abut the initial cutting-area pattern which thereby increases the size of the corresponding cut-gate section to the second value.

In some embodiments, relative to the second direction: the first size results in a first gap between the cut-gate section and the corresponding one of the first and second active area patterns; the second size results in a second gap between the cut-gate section and the corresponding one of the first and second active area patterns; and a size of the second gap is about 5/9 of a size of the first gap.

In some embodiments, the size of the second gap is about 5 nanometers (nm) and the size of the first gap is about 9 nm.

In some embodiments, relative to the second direction, a height of each cell is CH; and as measured from the boundary, the second size is about 0.05*CH.

In some embodiments, as measured from the boundary, the first size is about 0.1*CH.

In some embodiments, relative to the second direction: the first size results in a first gap between the cut-gate section and the corresponding one of the first and second active area patterns; relative to the second direction, a height of each cell is CH; and the first gap is about 0.01*CH.

In some embodiments, relative to the second direction: the second size results in a second gap between the cut-gate section and the corresponding one of the first and second active area patterns; and the second gap is about 0.25*CH.

In some embodiments, for a majority of the intersecting gate patterns, the size is increased to the second size; and for a minority of the intersecting gate patterns, the size is the first value.

In some embodiments, for at least about 75% of the intersecting gate patterns, the size is increased to the second value; and for at most about 25% of the intersecting gate patterns, the size is reverted to the first value.

In some embodiments, for about 87.5% of the selected gate patterns, the size the size is set to the second size.

In some embodiments, for each of the selected gate patterns, the corresponding VG pattern substantially overlaps the corresponding first or second active area pattern.

In some embodiments, for each of the gate patterns which are not selected, the corresponding VG pattern substantially does not overlap the corresponding first or second active area pattern.

In some embodiments, a system (of manufacturing a semiconductor device for which a corresponding layout diagram is stored on a non-transitory computer-readable medium) includes at least one processor and at least one memory including computer program code for one or more programs, the layout diagram including active area patterns extending in a first direction, gate patterns extending in a second direction perpendicular to the first direction and overlying corresponding ones of the active area patterns, and via-to-gate (VG) patterns overlying corresponding ones of the gate patterns, and wherein the at least one memory, the computer program code and the at least one processor are configured to cause the system to execute a method of generating the layout diagram including: regarding first and second ones of the active area patterns which (1) are correspondingly nearest to a boundary between, and (2) are correspondingly in, first and second abutting cells, and for each of the gate patterns that intersects the first or second active area pattern, selecting ones among the gate patterns for which a first distance from a nearest corresponding VG pattern to a corresponding cut-gate section is equal to or greater than a first reference value relative to the second direction; and the selected gate patterns representing a majority of the intersecting gate patterns; for each of the selected gate patterns, relative to a first size, setting a size of a corresponding cut-gate section to a second size; the first size otherwise resulting in an overhang of a remnant portion of the gate pattern extending towards the boundary by a first length; and the second size resulting in the overhang extending towards the boundary by a second length smaller than the first length.

In some embodiments, the selected gate patterns represent at least about 75% of the intersecting gate patterns.

In some embodiments, the selected gate patterns represent at least about 87.5% of the intersecting gate patterns.

In some embodiments, the system further includes at least one of: a first masking facility configured to fabricate one or more semiconductor masks based on based on the layout diagram; or a second masking facility configured to perform one or more lithographic exposures based on the layout diagram; or a fabricating facility configured to fabricate at least one component in a layer of a semiconductor device based on the layout diagram.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device for which a corresponding layout diagram is stored on a non-transitory computer-readable medium, the layout diagram including active area patterns extending in a first direction, gate patterns extending in a second direction perpendicular to the first direction and overlying corresponding ones of the active area patterns, and via-to-gate (VG) patterns overlying corresponding ones of the gate patterns, the method comprising generating the layout diagram including:

regarding first and second ones of the active area patterns which (1) are correspondingly nearest to a boundary between, and (2) are correspondingly in, first and second abutting cells, and for each of the gate patterns that intersects the first or second active area pattern, selecting ones among the gate patterns for which a first distance from a nearest corresponding VG pattern to a corresponding cut-gate section is equal to or greater than a first reference value relative to the second direction; and for each of the selected gate patterns, relative to a first size, setting a size of a corresponding cut-gate section to a second size;

the first size otherwise resulting in an overhang of a remnant portion of the gate pattern extending towards the boundary by a first length; and the second size resulting in the overhang extending towards the boundary by a second length smaller than the first length.

2. The method of claim 1, wherein:

the second length is a minimal permissible amount of overhang of the remnant portion.

3. The method of claim 1, further comprising:

based on the layout diagram, at least one of:

(A) making one or more photolithographic exposure;

(B) fabricating one or more semiconductor masks; or (C) fabricating at least one component in a layer of a semiconductor integrated circuit.

4. The method of claim 1, wherein:

relative to the second direction:

the first size results in a first gap between the cut-gate section and the corresponding one of the first and second active area patterns;

the second size results in a second gap between the cut-gate section and the corresponding one of the first and second active area patterns; and a size of the second gap is about 5/9 of a size of the first gap.

5. The method of claim 4, wherein:

the size of the second gap is about 5 nanometers (nm) and the size of the first gap is about 9 nm.

6. The method of claim 1, wherein:

relative to the second direction, a height of each cell is CH; and as measured from the boundary, the second size is about 0.05*CH.

7. The method of claim 6, wherein:

as measured from the boundary, the first size is about 0.1*CH.

8. A method of manufacturing a semiconductor device for which a corresponding layout diagram is stored on a non-transitory computer-readable medium, the layout diagram including active area patterns extending in a first direction, gate patterns extending in a second direction perpendicular to the first direction and overlying corresponding ones of the active area patterns, and via-to-gate (VG) patterns overlying corresponding ones of the gate patterns, the method comprising generating the layout diagram including:

regarding first and second ones of the active area patterns which (1) are correspondingly nearest to a boundary between, and (2) are correspondingly in, first and second abutting cells, and for each of the gate patterns that intersects the first or second active area pattern:

relative to a first size, setting a size of a corresponding cut-gate section to a second size;

the first size otherwise resulting in an overhang of a remnant portion of the gate pattern extending towards the boundary by a first length; and the second size resulting in the overhang extending towards the boundary by a second length smaller than the first length; and selecting ones among the gate patterns for which a first distance from a nearest corresponding VG pattern to the corresponding cut-gate section is less than a first reference value relative to the second direction; and for each of the selected gate patterns, reducing the size of the corresponding cut-gate section from the second size to the first size.

9. The method of claim 8, wherein:

the second length is a minimal permissible amount of overhang of the remnant portion.

10. The method of claim 8, wherein:

each cut-gate section includes an initial cutting-area pattern; and the setting includes:

adding a supplemental cutting-area pattern to abut the initial cutting-area pattern which thereby increases the size of the corresponding cut-gate section to the second size.

11. The method of claim 10, wherein:

the reducing includes:

removing the supplemental cutting-area pattern to abut the initial cutting-area pattern which thereby increases the size of the corresponding cut-gate section to the second size.

12. The method of claim 8, wherein:

relative to the second direction:

the first size results in a first gap between the cut-gate section and the corresponding one of the first and second active area patterns;

the second size results in a second gap between the cut-gate section and the corresponding one of the first and second active area patterns; and a size of the second gap is about ⅚ of a size of the first gap.

13. The method of claim 8, wherein:

relative to the second direction, a height of each cell is CH; and as measured from the boundary, the second size is about 0.05*CH.

14. The method of claim 13, wherein:

as measured from the boundary, the first size is about 0.1*CH.

15. The method of claim 8, wherein:

relative to the second direction:

the first size results in a first gap between the cut-gate section and the corresponding one of the first and second active area patterns;

relative to the second direction, a height of each cell is CH; and the first gap is about 0.01*CH.

16. The method of claim 8, wherein:

relative to the second direction:

the second size results in a second gap between the cut-gate section and the corresponding one of the first and second active area patterns; and the second gap is about 0.25*CH.

17. A system of manufacturing a semiconductor device for which a corresponding layout diagram is stored on a non-transitory computer-readable medium, the system comprising at least one processor and at least one memory including computer program code for one or more programs, the layout diagram including active area patterns extending in a first direction, gate patterns extending in a second direction perpendicular to the first direction and overlying corresponding ones of the active area patterns, and via-to-gate (VG) patterns overlying corresponding ones of the gate patterns, and wherein the at least one memory, the computer program code and the at least one processor are configured to cause the system to execute a method of generating the layout diagram including:

regarding first and second ones of the active area patterns which (1) are correspondingly nearest to a boundary between, and (2) are correspondingly in, first and second abutting cells, and for each of the gate patterns that intersects the first or second active area pattern, selecting ones among the gate patterns for which a first distance from a nearest corresponding VG pattern to a corresponding cut-gate section is equal to or greater than a first reference value relative to the second direction; and the selected gate patterns representing a majority of the intersecting gate patterns;

for each of the selected gate patterns, relative to a first size, setting a size of a corresponding cut-gate section to a second size;

the first size otherwise resulting in an overhang of a remnant portion of the gate pattern extending towards the boundary by a first length; and the second size resulting in the overhang extending towards the boundary by a second length smaller than the first length.

18. The system of claim 17, wherein:

the selected gate patterns represent at least about 75% of the intersecting gate patterns.

19. The system of claim 18, wherein:

the selected gate patterns represent at least about 87.5% of the intersecting gate patterns.

20. The system of claim 17, further comprising at least one of:

a first masking facility configured to fabricate one or more semiconductor masks based on the layout diagram; or a second masking facility configured to perform one or more lithographic exposures based on the layout diagram; or a fabricating facility configured to fabricate at least one component in a layer of a semiconductor device based on the layout diagram.

* * * * *